(12) United States Patent
Kanazashi et al.

(10) Patent No.: US 6,567,923 B2
(45) Date of Patent: May 20, 2003

(54) SEMICONDUCTOR MEMORY DEVICE ACHIEVING FASTER OPERATION BASED ON EARLIER TIMINGS OF LATCH OPERATIONS

(75) Inventors: Kazuyuki Kanazashi, Kawasaki (JP); Toshiya Uchida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 119 days.

(21) Appl. No.: 09/875,127

(22) Filed: Jul. 30, 2001

(65) Prior Publication Data

US 2002/0026599 A1 Feb. 28, 2002

Related U.S. Application Data

(62) Division of application No. 09/104,374, filed on Jun. 25, 1998, now Pat. No. 6,330,682.

(30) Foreign Application Priority Data

Jun. 26, 1997 (JP) .............................. 9-170070
Mar. 25, 1998 (JP) .............................. 10-77952

(51) Int. Cl.[7] .............................. G06F 1/04; G06F 12/00
(52) U.S. Cl. ........................ 713/500; 713/400; 711/100; 711/167
(58) Field of Search ................................. 713/400, 401, 713/500, 503, 600; 716/1, 6; 711/100, 167

(56) References Cited

U.S. PATENT DOCUMENTS

| | | | | | |
|---|---|---|---|---|---|
| 5,586,286 | A | * | 12/1996 | Santeler et al. .............. | 711/105 |
| 5,813,023 | A | * | 9/1998 | McLaury ..................... | 711/105 |
| 5,835,448 | A | * | 11/1998 | Ohtani et al. ................ | 365/233 |
| 5,845,315 | A | * | 12/1998 | Cutter ......................... | 711/104 |
| 6,279,116 | B1 | * | 8/2001 | Lee ............................. | 713/601 |
| 6,373,752 | B1 | * | 4/2002 | Wright et al. .......... | 365/189.05 |

* cited by examiner

Primary Examiner—Dennis M. Butler
(74) Attorney, Agent, or Firm—Arent Fox Kintner Plotkin & Kahn, PLLC

(57) ABSTRACT

A semiconductor memory device having an internal circuit includes a command decoder which decodes input-command signals to supply decoded-command signals, an address-latch-signal-generation circuit, operating faster than the command decoder, which decodes the input-command signals to supply an address-latch signal, and a control circuit which controls the internal circuit based on the decoded-command signals. The semiconductor memory device further includes an address-input circuit which latches an address signal in response to the address-latch signal.

5 Claims, 22 Drawing Sheets

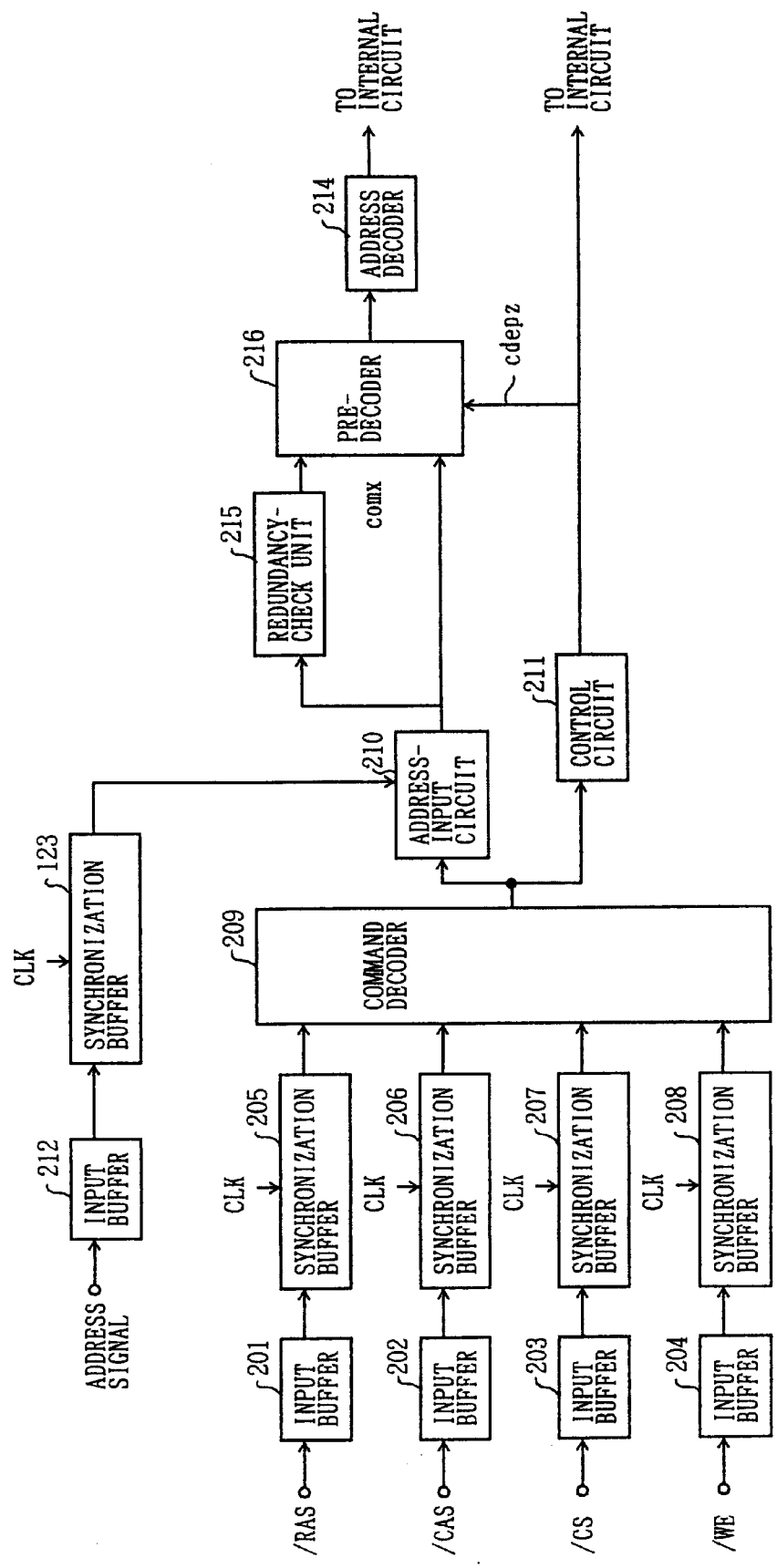
F I G. 9

SEMICONDUCTOR MEMORY DEVICE ACHIEVING FASTER OPERATION BASED ON EARLIER TIMINGS OF LATCH OPERATIONS

This is a division of application Ser. No. 09/104,374, filed Jun. 25, 1998 now U.S. Pat. No. 6,330,682.

BACKGROUND OF THE INVENTION

1. Field of the Invention

The present invention generally relates to semiconductor memory devices, and particularly relates to adjustment of timings at which address signals and data signals are latched.

2. Description of the Related Art

FIG. 1 is a block diagram of a command-input and address-input portion of a related-art semiconductor device.

As shown in FIG. 1, command-input signals /CAS (column address strobe), /RAS (row address strobe), /CS (chip select), and /WE (write enable) are input to input buffers 201 through 204. The input buffers 201 through 204 are current-mirror-type buffers, and produce a HIGH-level output or a LOW-level output depending on a comparison between an input signal and a reference voltage level.

The command signals output from the input buffers 201 through 204 are supplied to synchronization buffers 205 through 208, respectively, where synchronization is established between the command signals and a clock signal CLK. The command signals in synchronism with the clock signal CLK are supplied from the synchronization buffers 205 through 208 to a command decoder 209.

The command decoder 209 decodes the command signals /CAS, /RAS, /CS, and /WE so as to output command-decode signals. When the command signals /CAS, /RAS, /CS, and /WE are LOW, HIGH, LOW, and HIGH, respectively, for example, a data-read operation is selected, and the command-decode signals represent the data-read operation. When the command signals /CAS, /RAS, /CS, and /WE are LOW, HIGH, LOW, and LOW, respectively, for example, a data-write operation is selected, and the command-decode signals indicate this fact.

When either a data-write operation or a data-read operation is indicated, an address-input circuit 210 latches address signals at a timing triggered by the command-decode signals supplied from the command decoder 209. The address latched by the address-input circuit 210 is supplied to internal circuits. A control circuit 211 controls the internal circuits so as to achieve the operation which is indicated by the command-decode signals supplied from the command decoder 209. In FIG. 1, signal lines from the command decoder 209 to the address-input circuit 210 and the control circuit 211 are shown in a simplified manner. In actuality, a plurality of signal lines are provided for these paths.

The command decoder 209 is implemented by using a logic circuit of a relatively simple structure, but is designed to reduce an effect of skews between the command signals. Because of this, there is a problem in that a signal delay is relatively large in the command decoder 209. Assume that a two-input NAND circuit is used in the command decoder 209, and receives a first input signal and a second input signal, where the second signal is supposed to change from LOW to HIGH at the same timing at which the first signal changes from HIGH to LOW. If there is an unexpected delay in the change from HIGH to LOW in the first input signal, both signals maintain a HIGH level simultaneously during a short time period. The NAND circuit thus ends up outputting an erroneous signal level. In order to obviate this problem, a gate width of the transistors in the NAND circuit is made narrower, thereby slowing a change in the signal level. This prevents an erroneous signal level from appearing as an output for a short time period.

When a signal delay at the command decoder 209 is elongated because of such a measure as described above to cope with signal skews, a timing at which the address-input circuit 210 latches the address signals is also delayed. Until the address signals are latched and stabilized, a data-write/read operation cannot be started. The delay in the command decoder 209 thus hinders an effort to increase operation speed of the semiconductor memory device.

Accordingly, there is a need for a semiconductor memory device which allows a timing of the address-signal input to be advanced in time so as to achieve high-speed operations.

Similar problems also exist with regard to timings of address-signal decoding, redundant checking, data-signal latching, and burst-length control.

Accordingly, there is a further need for a semiconductor memory device which advances these timings so as to achieve high-speed operations.

SUMMARY OF THE INVENTION

Accordingly, it is a general object of the present invention to provide a semiconductor memory device which can satisfy the need described above.

It is another and more specific object of the present invention to provide a semiconductor memory device which allows a timing of the address-signal input to be advanced in time so as to achieve high-speed operations.

In order to achieve the above objects according to the present invention, a semiconductor memory device having an internal circuit includes a command decoder which decodes input-command signals to supply decoded-command signals, an address-latch-signal-generation circuit, operating faster than the command decoder, which decodes the input-command signals to supply an address-latch signal, a control circuit which controls the internal circuit based on the decoded-command signals, and an address-input circuit which latches an address signal in response to the address-latch signal.

In the device described above, the address-latch-signal-generation circuit is provided separately from the command decoder, and operates faster than the command decoder. Therefore, the timing of the address-signal latching becomes earlier than when the command decoder indicates such a timing.

According to one aspect of the present invention, the semiconductor memory described above is such that the command decoder includes a logic circuit operating at a first speed, and the address-latch-signal-generation circuit includes a logic circuit operating at a second speed faster than the first speed.

In the device described above, an operation speed of transistors is faster in the address-latch-signal-generation circuit than in the command decoder. Therefore, the timing of the address-signal latching becomes earlier than when the command decoder indicates such a timing.

According to another aspect of the present invention, the semiconductor memory device described above further includes input buffers which respectively receive the input-command signals from an exterior of the semiconductor memory device, first synchronization buffers which respectively receive the input-command signals from the input buffers, and supply the input-command signals to the command decoder in synchronism with a clock signal, a second synchronization buffer which receives the address-latch signal from the address-latch-signal-generation circuit, and supplies the address-latch signal to the address-input circuit in synchronism with the clock signal, wherein the address-latch-signal-generation circuit receives the input-command signals directly from the input buffers.

In the device described above, when a timing to establish synchronization with the clock signal is used as a reference, a timing at which the address-latch signal is input to the address-input circuit is earlier than a timing at which the decoded-command signals are input to the control circuit.

According to another aspect of the present invention, the semiconductor memory device described above is such that the first speed is set such that skews are sufficiently removed from the input-command signals when the command decoder decodes the command-input signals.

In the device described above, anti-skew measures are taken in the command decoder, so that malfunction of the semiconductor memory device can be prevented.

According to another aspect of the present invention, the semiconductor memory device described above is such that the second speed is faster than such speed as at least required to sufficiently remove the skews.

In the device described above, the anti-skew measures are put in place for the command decoder, while no such measures are taken for the address-latch-signal-generation circuit, which is thus free from a speed limit. Therefore, the timing of address input is made earlier, and, at the same time, malfunction of the semiconductor memory device can be prevented.

Also, in order to achieve the forgoing objects, a semiconductor memory device includes a command decoder which decodes input-command signals to supply decoded-command signals for controlling operations of the semiconductor memory device, and an address-latch-signal-generation circuit which decodes the input-command signals to supply an address-latch signal used for latching an address, wherein the address-latch-signal-generation circuit operates at a faster speed than the command decoder.

In the device described above, the address-latch-signal-generation circuit is provided separately from the command decoder, and operates faster than the command decoder. Therefore, the timing of the address-signal latching becomes earlier than when the command decoder indicates such a timing.

According to another aspect of the present invention, the semiconductor memory device described above is such that the command decoder operates at such speed as to sufficiently remove skews from the command-input signals when decoding the command-input signals, and the address-latch-signal-generation circuit operates at a speed faster than such speed as at least required to sufficiently remove the skews.

In the device described above, the anti-skew measures are put in place for the command decoder, while no such measures are taken for the address-latch-signal-generation circuit, which is thus free from a speed limit. Therefore, the timing of address input is made earlier, and, at the same time, malfunction of the semiconductor memory device can be prevented Further, in order to achieve the forgoing objects, a semiconductor memory device includes a command decoder which receives input-command signals after the input-command signals are synchronized with a clock signal, and decodes the input-command signals to supply decoded-command signals for controlling the semiconductor memory device, and an address-latch-signal-generation circuit which receives the input-command signals before the input-command signals are synchronized with the clock signal, and decodes the input-command signals to supply an address-latch signal used for latching an address.

In the device described above, a synchronization with the clock signal is established at a stage preceding the command decoder, whereas it is established at a stage following the address-latch-signal-generation circuit. When a timing to establish a synchronization with the clock signal is used as a reference, therefore, a timing at which the address-latch signal is input to the address-input circuit is earlier than a timing at which the decoded-command signals are input to the control circuit.

It is yet another object of the present invention to provide a semiconductor memory device which advances timings of address-signal decoding, redundant checking, data-signal latching, and burst-length control so as to achieve high-speed operations.

In order to achieve some of the above objectives, a semiconductor memory device includes a command decoder which decodes input-command signals to supply decoded-command signals, an address decoder which decodes input-address signals to supply decoded-address signals, and an address input circuit which latches the decoded-address signals supplied from the address decoder in response to at least one of the decoded-command signals.

In the device described above, the address decoder is provided at a stage preceding the address-input circuit, so that a time required for a decoding process in the address decoder can be ignored when a timing of the address-signal latching is used as a reference. Namely, the address data output from the address-input circuit can be immediately supplied to the internal circuit without any intervening cause of delay. This makes it possible to perform data-write operations and data-read operations at an earlier timing than otherwise it would be, thereby achieving a higher operation speed of the semiconductor memory device.

According to another aspect of the present invention, a semiconductor memory device includes a command decoder which decodes input-command signals to supply decoded-command signals, an address decoder which decodes input-address signals to supply decoded-address signals, an address-latch-signal-generation circuit which operates at a faster speed than the command decoder, and decodes the input-command signals to supply an address-latch signal, and an address-input circuit which latches the decoded-address signals supplied from the address decoder in response to the address-latch signal.

In the device described above, the address decoder is provided at a stage preceding the address-input circuit, so that a time required for a decoding process in the address decoder can be ignored. Also, the address-latch-signal-generation circuit is separately provided, and operates faster than the command decoder. Therefore, the timing of the address-signal latching becomes earlier than when the command decoder indicates such a timing.

According to another aspect of the present invention, a semiconductor memory device includes a command decoder which decodes input-command signals to supply decoded-command signals, buffers which receive input-address signals, an address-input circuit which latches the input-address signals supplied from the buffers in response to at least one of the decoded-command signals, a redundancy-check unit which receives the input-address signals from the buffers, and checks whether the input-address signals indicate a redundant address, and an address decoder which receives the input-address signals from the address-input circuit and redundancy-check results from the redundancy-check unit, and decodes the input-address signals to supply decoded-address signals in accordance with the redundancy-check results.

In the device described above, a redundancy check of the address signal is performed at least no later than the operation of the address-input circuit. Namely, the redundancy check of the address signal can be completed before the address-input circuit latches the address signals upon a trigger from the command decoder, which has a relatively long time delay. Therefore, a timing at which the decoded-address signals are output can be advanced in time.

According to another aspect of the present invention, the semiconductor memory device described above is such that the address decoder includes an address pre-decoder which receives the input-address signals from the address-input circuit and the redundancy-check results from the redundancy-check unit, and decodes the input-address signals to supply pre-decoded-address signals in accordance with the redundancy-check results, and a decoder which decodes the pre-decoded-address signals to supply the decoded-address signals.

In the device described above, a redundancy check of the address signal is performed at least no later than the operation of the address-input circuit. Namely, the redundancy check of the address signal as well as the pre-decode operation can be completed before the address-input circuit latches the address signals upon a trigger from the command decoder, which has a relatively long time delay. Therefore, a timing at which the decoded-address signals are output can be advanced in time.

According to another aspect of the present invention, a semiconductor memory device having an internal circuit includes a command decoder which decodes input-command signals to supply decoded-command signals, a data-acquisition-signal-generation circuit, operating faster than the command decoder, which decodes the input-command signals to supply a data-acquisition signal, a control circuit which controls the internal circuit based on the decoded-command signals, and a data-acquisition circuit which receives an input-data signal, and supplies the input-data signal to an output thereof in response to the data-acquisition signal.

In the device described above, the data-acquisition-signal-generation circuit is provided separately from the command decoder, and operates faster than the command decoder. Therefore, the timing of the data-signal acquisition becomes earlier than when the command decoder indicates such a timing.

According to another aspect of the present invention, the semiconductor memory device described above further includes a data-write circuit which writes the input-data supplied from the data-acquisition circuit in the internal circuit, the control circuit further controlling the data-write circuit based on the decoded-command signals.

In the device described above, the data-write circuit is controlled by the control circuit, so that no malfunction is expected as long as anti-skew measures are put in place in the command decoder. Because of this, the data-acquisition-signal-generation circuit can benefit from use of a faster logic circuit which ignores anti-skew consideration.

According to another aspect of the present invention, a semiconductor memory device includes a first circuit which supplies a burst-start-address-latch pulse in synchronism with a clock signal, the burst-start-address-latch pulse being used for latching a burst-start address supplied from an exterior of the semiconductor memory device, and a second circuit which supplies internally-generated-address-latch pulses in synchronism with the clock signal, the internally-generated-address-latch pulses being used for latching internal addresses which are internally generated to follow the burst-start address, wherein the second circuit includes a burst-length-control circuit which generates a period indicating signal for indicating a time period during which the internally-generated-address-latch pulses are generated, and a synchronization circuit which generates the internally-generated-address-latch pulses by synchronizing the period indicating signal to the clock signal.

In the device described above, the burst-length-control circuit is situated at a stage preceding the synchronization circuit, so that the burst-start-address-latch pulse and the internally-generated-address-latch pulses are supplied at a timing immediately following the clock synchronization.

According to another aspect of the present invention, the semiconductor memory device described above is such that the burst-length-control circuit includes a logic circuit which generates the period indicating signal based on input-command signals and other signals, the other signals including a signal indicative of an end of a burst period and a signal indicative of an active state which is set to the semiconductor memory device by the input-command signals.

In the device described above, the burst-length-control circuit can be implemented based on a simple logic circuit.

According to another aspect of the present invention, the semiconductor memory device described above is such that the first circuit includes a logic circuit which generates a burst-start signal when the input-command signals show a predetermined combination of signal levels, and a synchronization circuit which generates the burst-start-address-latch pulse by synchronizing the burst-start signal to the clock signal.

In the device described above, the circuit for generating the burst-start-address-latch pulse can be implemented based on a simple logic circuit.

Other objects and further features of the present invention will be apparent from the following detailed description when read in conjunction with the accompanying drawings.

BRIEF DESCRIPTION OF THE DRAWINGS

FIG. 9 is a block diagram of a related-art configuration which shows details of address decoding operations;

DESCRIPTION OF THE PREFERRED EMBODIMENTS

In the following, embodiments of the present invention will be described with reference to the accompanying drawings.

Figure 2:
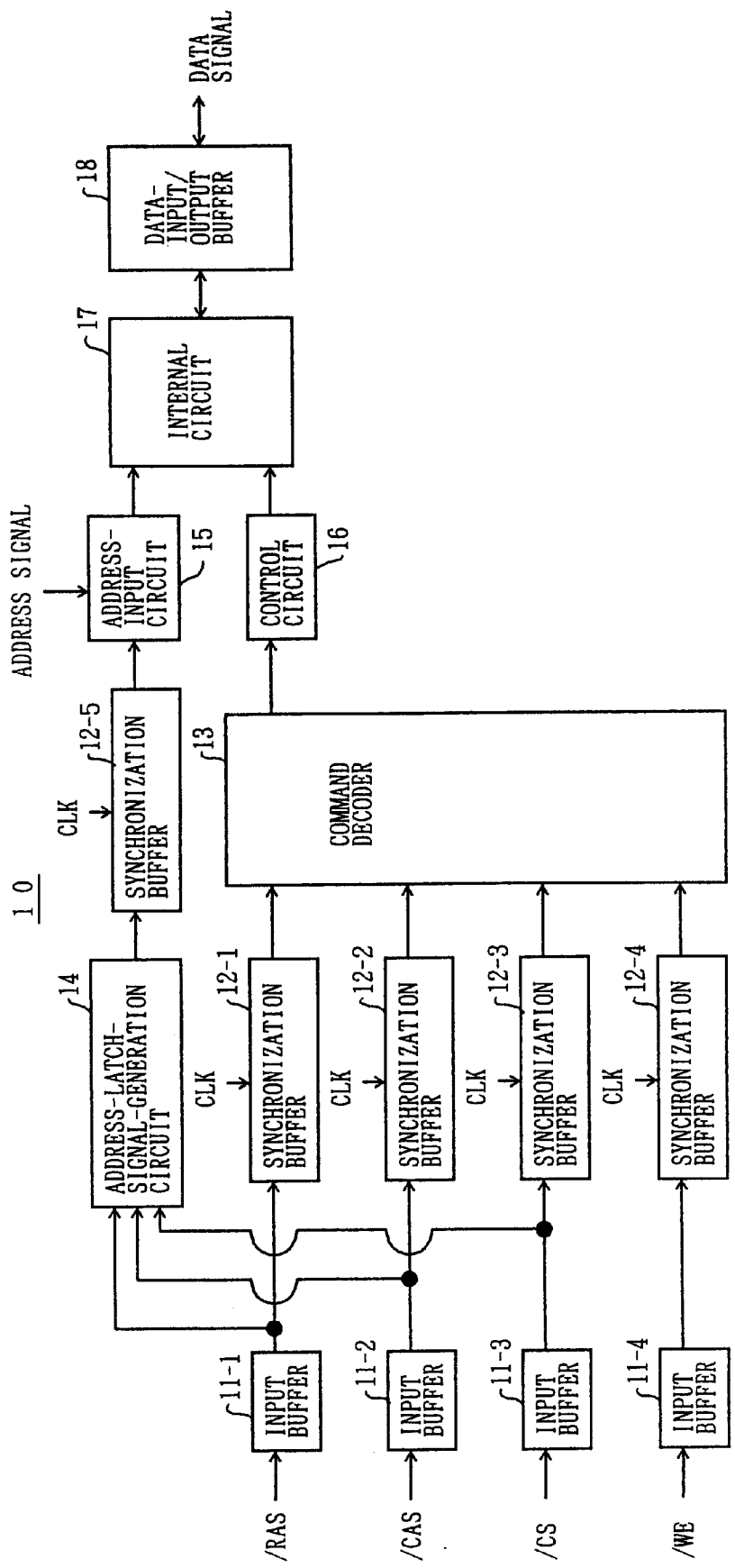
FIG. 2 is a block diagram of a semiconductor memory device according to the present invention.

FIG. 2 is a block diagram of a semiconductor memory device according to the present invention.

A semiconductor memory device 10 of FIG. 2 includes input buffers 11-1 through 11-4, synchronization buffers 12-1 through 12-5, a command decoder 13, an address-latch-signal-generation circuit 14, an address-input circuit 15, a control circuit 16, an internal circuit 17, and a data-input/output buffer 18.

Command-input signals /CAS, /RAS, /CS, and /WE are input to the input buffers 11-1 through 11-4. The input buffers 11-1 through 11-4 are current-mirror-type buffers, and produce a HIGH-level output or a LOW-level output depending on a comparison between an input signal and a reference voltage level.

The command signals output from the input buffers 11-1 through 11-4 are supplied to the synchronization buffers 12-1 through 12-4, respectively. Further, the command signals /RAS, /CAS, and /CS from the input buffers 11-1 through 11-3, respectively, are supplied to the address-latch-signal-generation circuit 14.

The synchronization buffers 12-1 through 12-4 establish synchronization between each command signal and the clock signal CLK, and the synchronized command signals are then supplied to the command decoder 13. The command decoder 13 decodes the command signals /CAS, /RAS, /CS, and /WE so as to output command-decode signals. The control circuit 16 controls the internal circuit 17 in accordance with the command signals supplied from the command decoder 13.

The address-latch-signal-generation circuit 14 is a logic circuit which allows signal-level changes to take place at high speed by forgoing anti-skew measures. When the command signals /RAS, /CAS, and /CS indicate either a data-write operation or a data-read operation, the address-latch-signal-generation circuit 14 supplies an address-latch signal to the synchronization buffer 12-5. The synchronization buffer 12-5 brings the address-latch signal in synchronism with the clock signal CLK, and sends the synchronized address-latch signal to the address-input circuit 15. The address-input circuit 15 latches address signals at a timing triggered by the address-latch signal from the synchronization buffer 12-5, and supplies the address signals to the internal circuit 17.

The internal circuit 17 is comprised of a memory-cell array, a word decoder, a column decoder, sense amplifiers, etc. Under the control of the control circuit 16, the internal circuit 17 accesses an indicated address based on the address signals supplied from the address-input circuit 15. Data-read/write operations are conducted between the accessed address and the data-input/output buffer 18.

As described above, the present invention provides the address-latch-signal-generation circuit 14 for the purpose of address input separately from the command decoder 13 for operation control. The address-latch-signal-generation circuit 14 decodes command signals to generate the address-latch signal, which is synchronized with the clock signal CLK by the synchronization buffer 12-5. When a timing of establishing synchronization with the clock signal CLK is viewed as a timing to mark a start, the command decoder 13 serves as a delay element along a path where it resides, whereas the address-latch signal is directly supplied from the synchronization buffer 12-5 to the address-input circuit 15 along a route where the address-latch-signal-generation circuit 14 resides. When counting time from the timing of establishing synchronization, therefore, the present invention can advance the timing of the address input at the address-input circuit 15 as compared to the related art.

The reason why the timing of address input can be advanced is that the address-latch-signal-generation circuit 14 is comprised of a high-speed logic circuit. Likewise, the reason why the address-latch-signal-generation circuit 14 can be provided at a stage preceding the synchronization buffer 12-5 is that the address-latch-signal-generation circuit 14 is a high-speed logic circuit achieving a faster signal change. The above description has been provided by using the timing of establishing synchronism with the clock signal CLK as a start timing when explaining how the timing of address-signal input can be advanced. In effect, however, the address-latch-signal-generation circuit 14 may be provided at a stage following the synchronization buffer 12-5. Even in this case, the semiconductor memory device can achieve the same improvement in that the address input timing is advanced.

The address-latch-signal-generation circuit 14 does not take into account any anti-skew measures. It is possible that the address-latch-signal-generation circuit 14 erroneously generates the address-latch signal even when no data-read/write operation is indicated. In this case, however, the control circuit 16 does not perform either the data-read operation or the data-write operation although the address-input circuit 15 may erroneously latch meaningless address data and supply the same to the internal circuit 17. In other words, the operations of the internal circuit 17 are controlled by the control circuit 16, so that no malfunction takes place as long as the command decoder 13 attends to an anti-skew measure. Because of this, a high-speed logic circuit which ignores an influence of skews can be used for latching the address input.

Figure 3:
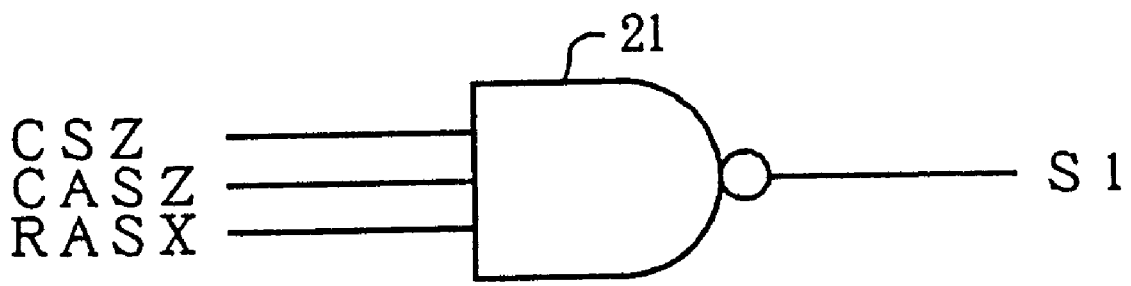
FIG. 3 is a circuit diagram showing an example of an address-latch-signal-generation circuit shown in FIG. 2.

FIG. 3 is a circuit diagram showing an example of the address-latch-signal-generation circuit 14 shown in FIG. 2.

The address-latch-signal-generation circuit 14 of FIG. 3 includes a NAND circuit 21 which uses transistors having a gate that is sufficiently wide. The NAND circuit 21 receives signals CASZ, RASX, and CSZ from the input buffers 11-1 through 11-3 of FIG. 2. Here, the signal CASZ is an inverse of the command-input signal /CAS, and the signal RASX is the same logic as the command-input signal /RAS. Further, the signal CSZ is an inverse of the command-input signal /CS. When the signals CASZ, RASX, and CSZ all become HIGH, the NAND circuit 21 changes the address-latch signal S1 to LOW.

Figure 4:
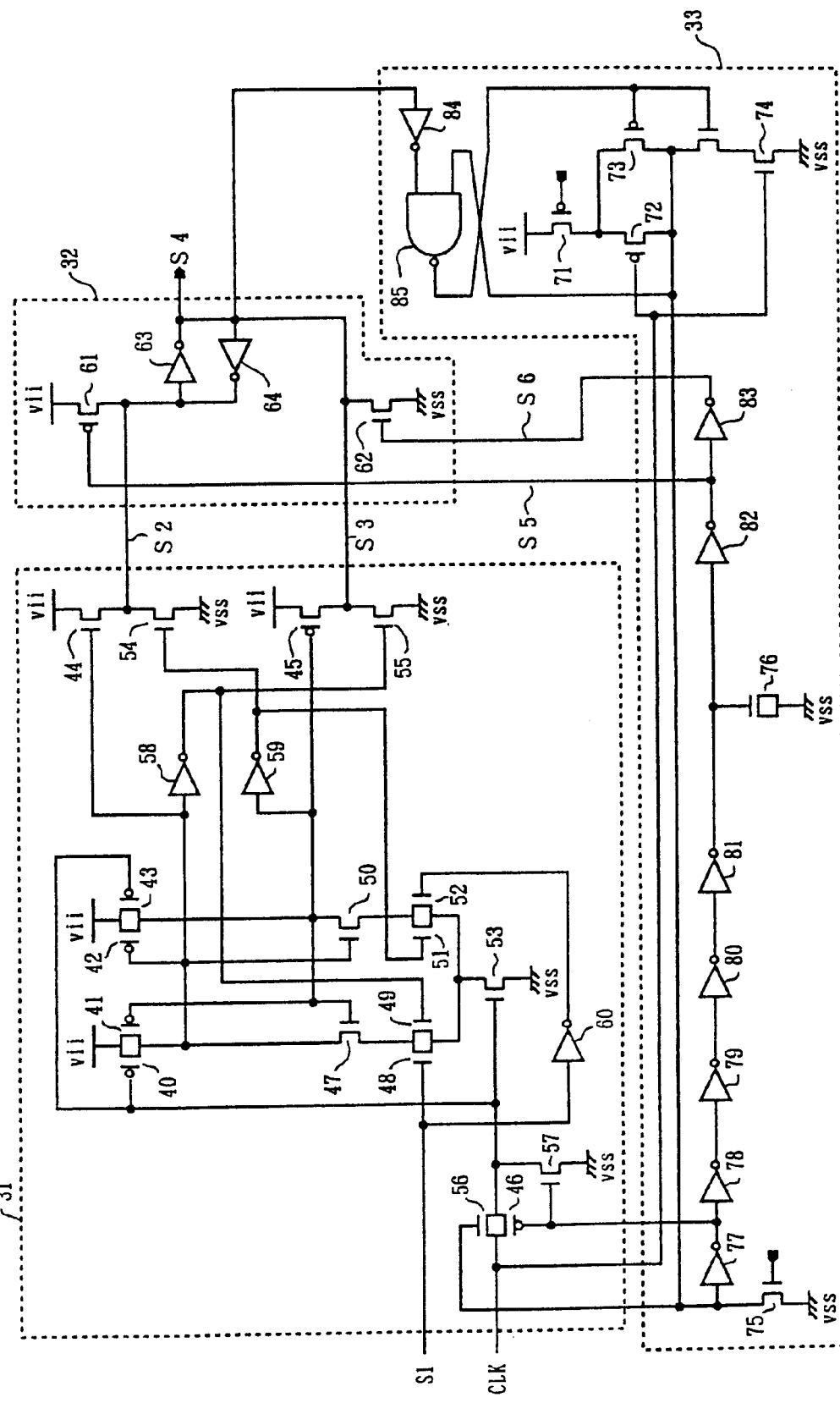
FIG. 4 is a circuit diagram showing an example of a synchronization buffer shown in FIG. 2.

FIG. 4 is a circuit diagram showing an example of the synchronization buffer 12-5 shown in FIG. 2. The synchronization buffers 12-1 through 12-4 of FIG. 2 have the same configuration as the synchronization buffer 12-5.

The synchronization buffer 12-5 includes a clock-synchronization circuit 31, a latch circuit 32, and a latch-reset circuit 33.

The clock-synchronization circuit 31 includes PMOS transistors 40 through 46, NMOS transistors 47 through 57, and inverters 58 through 60. The latch circuit 32 includes a PMOS transistor 61, an NMOS transistor 62, and inverters 63 and 64. The latch-reset circuit 33 includes PMOS transistors 71 through 73, NMOS transistors 74 and 75, a capacitor 76, inverters 77 through 84, and a NAND circuit 85.

The clock-synchronization circuit 31 receives the clock signal CLK and the address-latch signal S1 from the address-latch-signal-generation circuit 14, and changes output signals S2 and S3 to LOW and HIGH, respectively, in synchronism with the clock signal CLK when the address-latch signal S1 is LOW. A latch comprised of the inverters 63 and 64 in the latch circuit 32 latches the signals S2 and S3 supplied from the clock-synchronization circuit 31, and outputs a signal S4 which is HIGH. In this manner, the synchronization buffer 12-5 outputs an address-latch signal S4.

The latch-reset circuit 33 changes signals S5 and S6 to LOW and HIGH, respectively, at an end of a predetermined time period after the signal S4 is changed to HIGH. The predetermined time period is determined by a delay time of a delay line which is comprised of the inverters 77 through 83 and the capacitor 76. In the clock-synchronization circuit 31, the NMOS transistor 56 and the PMOS transistor 46 have been turned off by this point of time, so that the clock signal CLK does not enter the circuit. In the latch circuit 32, the signals S5 and S6 turn on the PMOS transistor 61 and the NMOS transistor 62, respectively, so that the latch comprised of the inverters 63 and 64 latches a LOW signal as the signal S4.

In summary, the synchronization buffer 12-5 of FIG. 4 changes the address-latch signal S4 to HIGH in synchronism with the clock signal CLK when the address-latch signal S1 from the address-latch-signal-generation circuit 14 shown in FIG. 3 changes to LOW, and, also, changes the address-latch signal S4 back to LOW after the predetermined time period passes.

Figure 5:
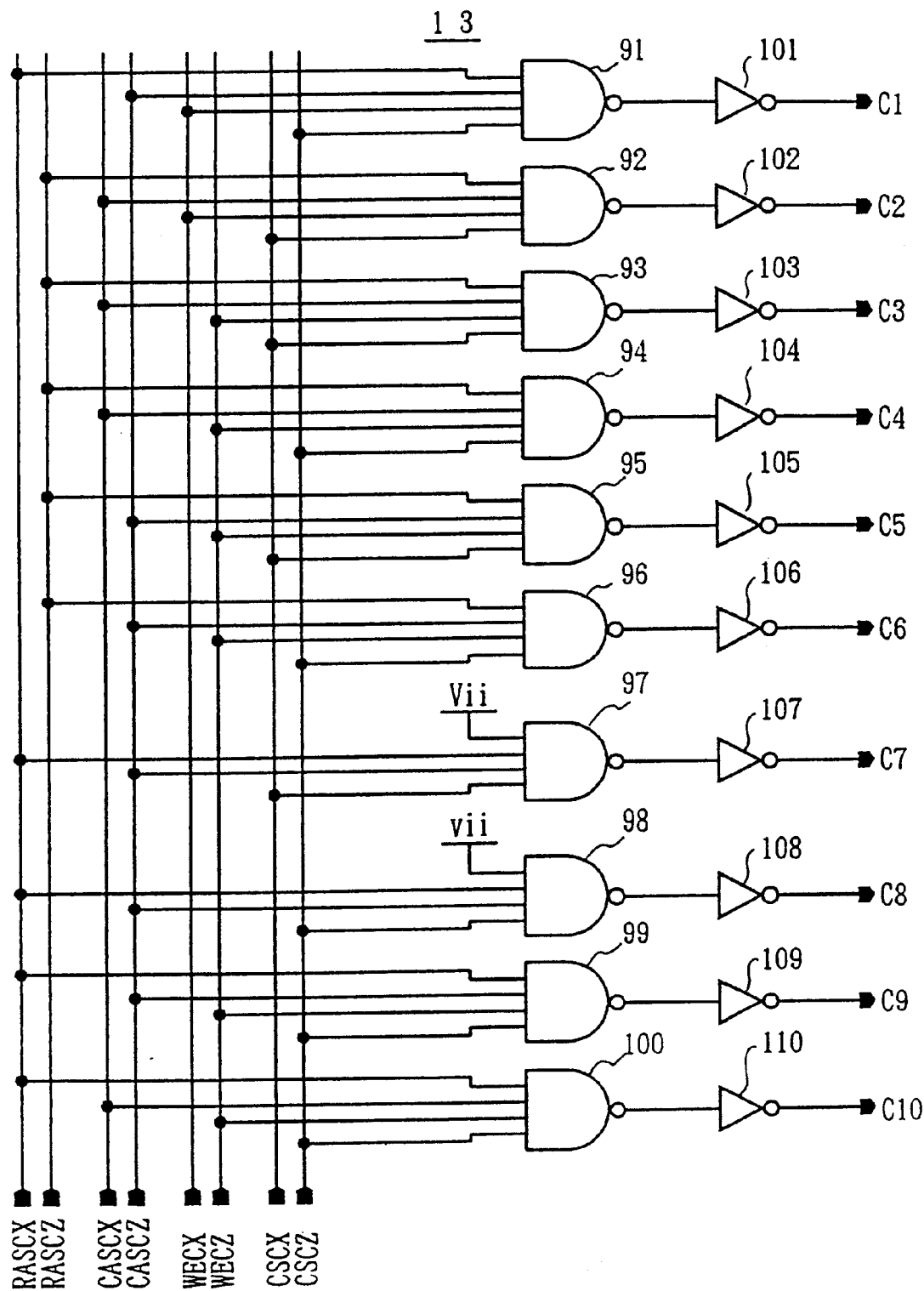
FIG. 5 is a circuit diagram showing an example of a command decoder shown in FIG. 2.

FIG. 5 is a circuit diagram showing an example of the command decoder 13 shown in FIG. 2.

The command decoder 13 of FIG. 5 includes NAND circuits 91 through 100 and inverters 101 through 110. Each pair of one of the NAND circuits 91 through 100 and a corresponding one of the inverters 101 through 110 constitutes an AND circuit, which generates a HIGH output only when input signals to the command decoder 13 exhibit an appropriate combination of signal levels.

The NAND circuits 91 through 100 and the inverters 101 through 110 are comprised of transistors having a relatively narrow gate width, so that an appropriate measure is taken to insure that erroneous outputs do not appear even when there is a skew (timing displacement) between the input signals.

The input signals to the command decoder 13 are obtained after the command-input signals are buffered by the input buffers 11-1 through 11-4 and are synchronized by the synchronization buffers 12-1 through 12-4. A signal RASCX is the same logic as the command-input signal /RAS, and a signal RASCZ has an inverted logic to the command-input signal /RAS. By the same token, signals ending with a letter "X" are the same logic as corresponding command-input signals, and signals ending with a letter "Z" have an inverted logic to corresponding command-input signals.

In the command decoder 13 of FIG. 5, a signal C1, for example, becomes HIGH only when a data-read operation is indicated, and a signal C9, for example, becomes HIGH only during a data-write operation. Signals C1 through C10 are supplied to the control circuit 16 of FIG. 2, so that the control circuit 16 controls the internal circuit 17 to perform an indicated operation.

In the semiconductor device shown in FIG. 2, the input buffers 11-1 through 11-4, the address-input circuit 15, the control circuit 16, the internal circuit 17, and the data-input/output buffer 18 are well within the scope of ordinary skill in the art, and a description thereof will be omitted.

Figure 6:
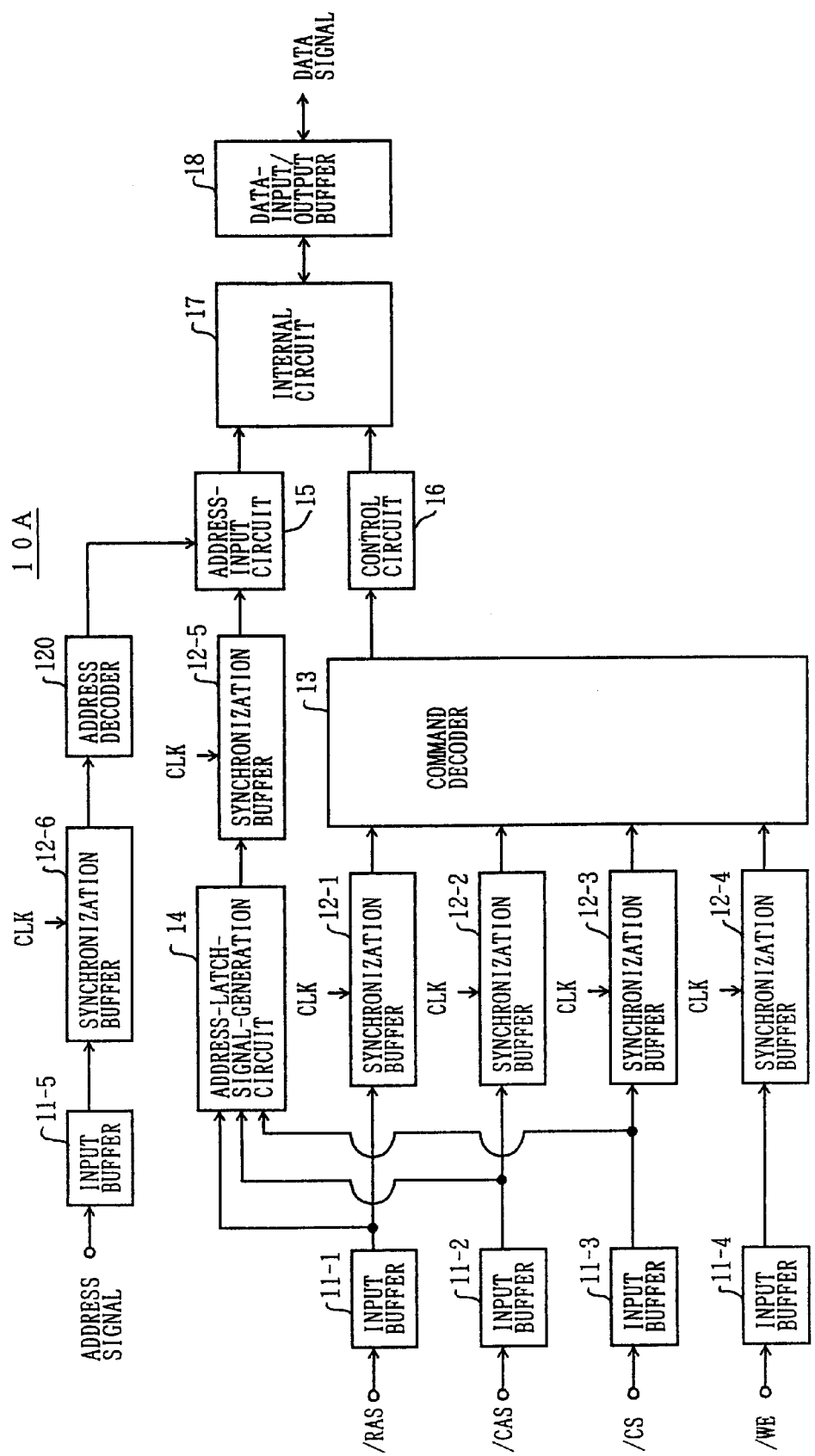
FIG. 6 is a block diagram of a second embodiment of a semiconductor memory device according to the present invention.

FIG. 6 is a block diagram of a second embodiment of a semiconductor memory device according to the present invention.

Figure 1:
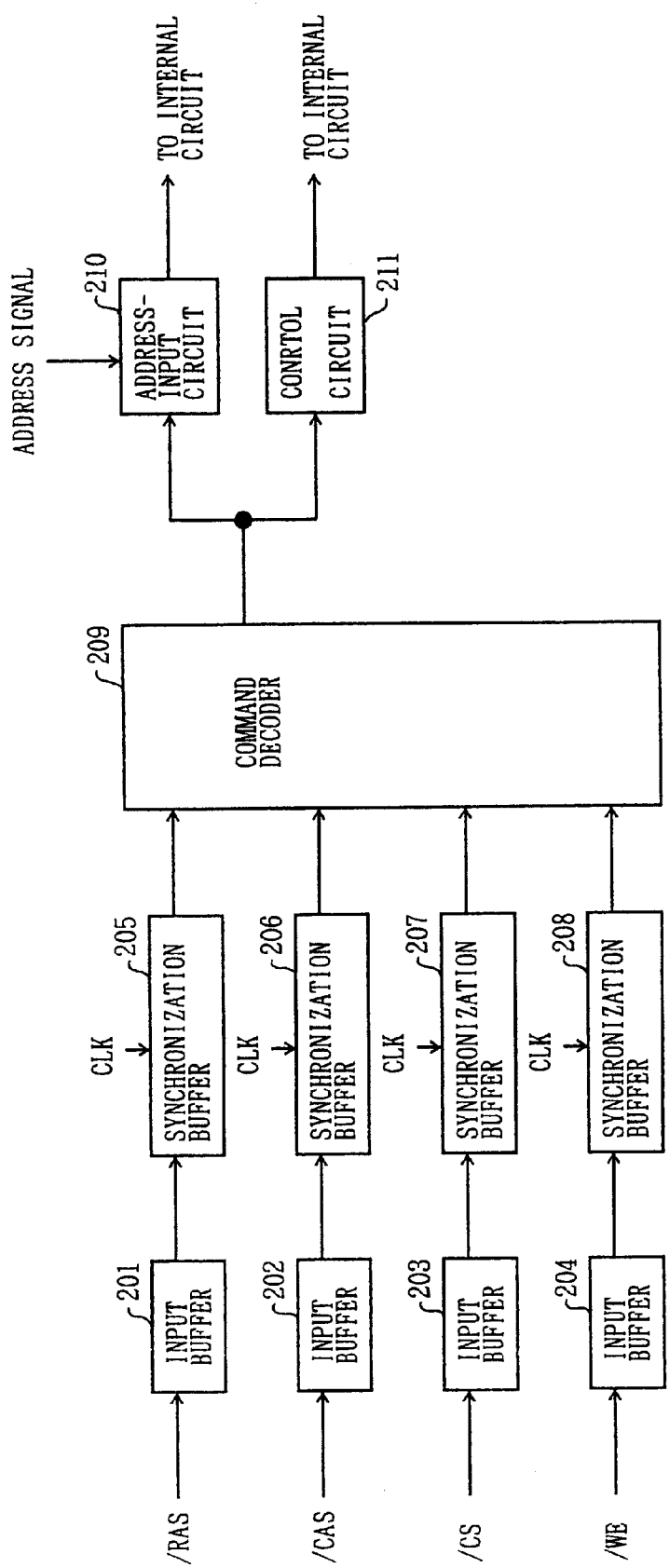
FIG. 1 is a block diagram of a command-input and address-input portion of a related-art semiconductor device.

FIG. 6 shows a position where decoding is performed with respect to address signals in the semiconductor memory device of FIG. 2. In FIG. 6, the same elements as those of FIG. 1 are referred to by the same numerals, and a description thereof will be omitted.

The semiconductor memory device 10A of FIG. 6 includes an input buffer 11-5, a synchronization buffer 12-6, and an address decoder 120 additionally provided to the semiconductor memory device of FIG. 2.

The input buffer 11-5 is a current-mirror-type buffer, and produces a HIGH-level output or a LOW-level output depending on a comparison between a respective one of the address-input signals and a reference voltage level. The address signals output from the input buffer 11-5 are supplied to the synchronization buffer 12-6, where synchronization is established between the address signals and the clock signal CLK. The address signals in synchronism with the clock signal CLK are supplied from the synchronization buffer 12-6 to the address decoder 120.

The address decoder 120 decodes the address signals, and supplies decode-address signals to the address-input circuit 15. The address-input circuit 15 latches the decoded-address signal based on the address-latch signal which is generated by the address-latch-signal-generation circuit 14. As described in connection with FIG. 1, the address-latch-signal-generation circuit 14 is comprised of a high-speed logic circuit.

Figure 7:
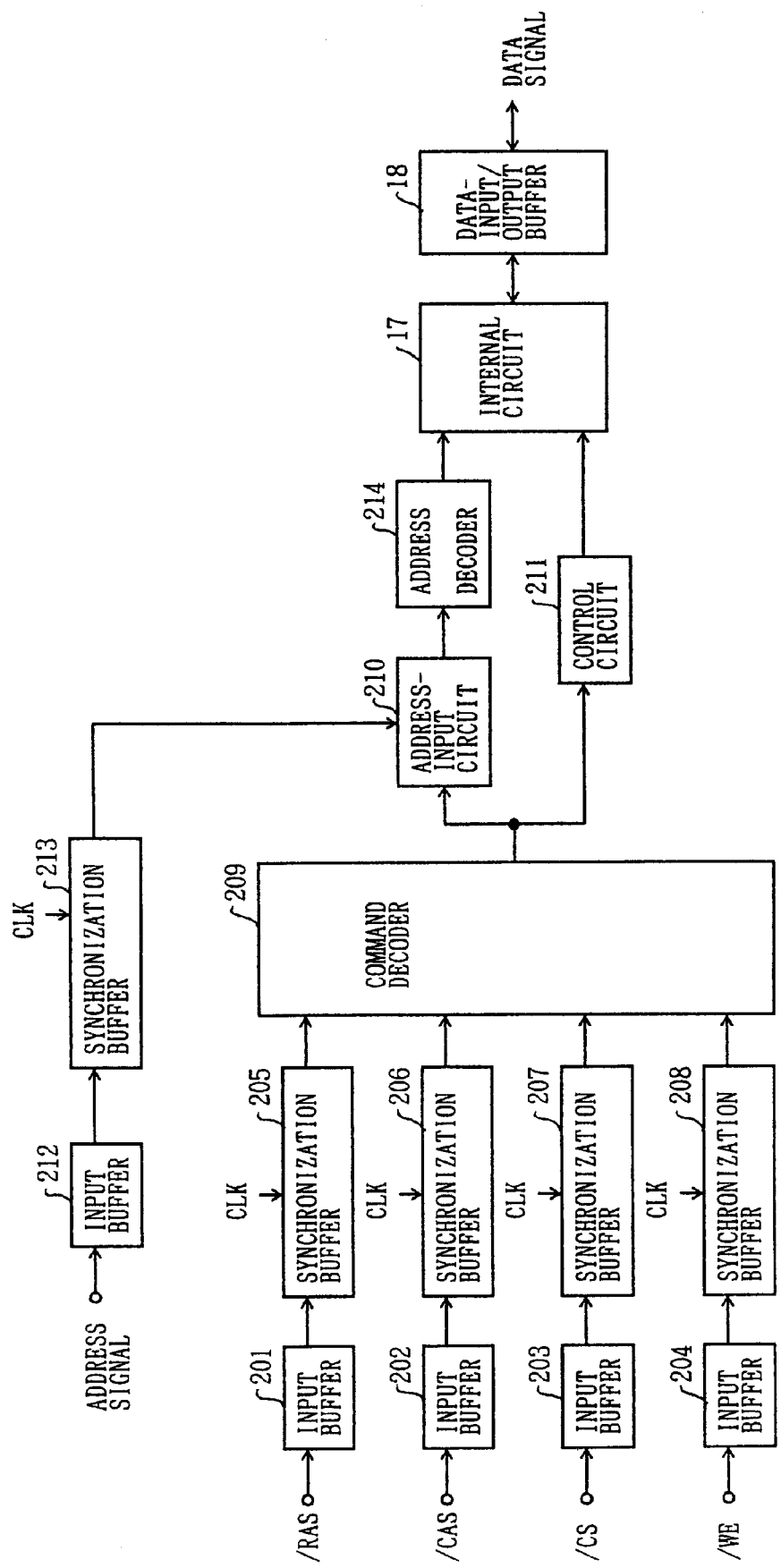
FIG. 7 is a block diagram of a related-art configuration showing a position where decoding is performed on address signals.

FIG. 7 is a block diagram of a related-art configuration showing a position where decoding is performed on address signals. A comparison should be made with the configuration of FIG. 6.

In the related-art configuration of FIG. 7, an address decoder 214 is situated at a stage following the address-input circuit 210. Namely, the address-input circuit 210 receives input address signals via an input buffer 212 and a synchronization buffer 213. Then, the address signals are supplied from the address-input circuit 210 to the address decoder 214, where they are decoded. Because of this configuration, there is a time gap between a timing at which the address-input circuit 210 latches the address signals and a timing at which the address data is supplied to the internal circuit 17, and this time gap is equivalent to the time period required for the decoding process performed by the address decoder 214.

In the configuration of FIG. 6, the address decoder 120 is provided at a stage preceding the address-input circuit 15, so that the time required for the decoding process by the address decoder 120 can be ignored. Namely, the address data output from the address-input circuit 15 can be immediately supplied to the internal circuit 17 without any intervening cause of delay. This makes it possible to perform data-write operations and data-read operations at an earlier timing than otherwise it would be, thereby achieving a higher operation speed of the semiconductor memory device.

The input buffer 11-5, the synchronization buffer 12-6, and the address decoder 120 have the same configuration as those of the input buffer 212, the synchronization buffer 213, and the address decoder 214 used in the related art. A description thereof is thus omitted.

The configuration which provides the address decoder at a stage preceding the address-input circuit, as shown in FIG. 6, can be used alone, i.e., without any combination with other embodiments.

Figure 8:
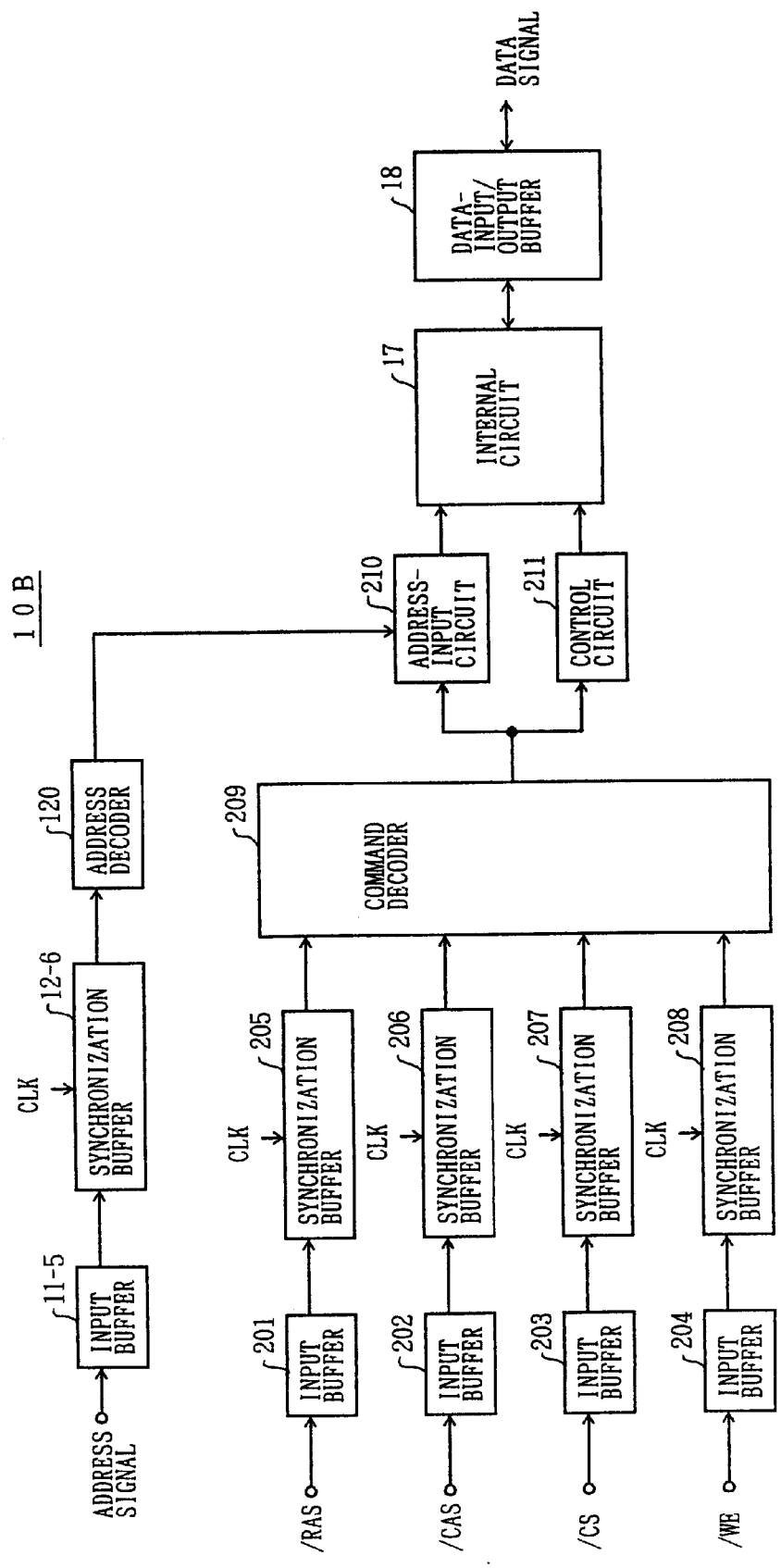
FIG. 8 is a block diagram of a third embodiment of a semiconductor memory device according to the present invention.

FIG. 8 is a block diagram of a third embodiment of a semiconductor memory device according to the present invention.

FIG. 8 shows a configuration in which an address decoder is provided at a stage preceding an address-input circuit when such a configuration is used alone. In FIG. 8, the same elements as those of FIGS. 1 and 2 are referred to by the same elements, and a description thereof will be omitted.

In FIG. 8, the address-latch-signal-generation circuit 14 of FIG. 2 is not provided, so that a timing at which the address-input circuit 210 latches the address signal is the same as that used in the related-art configuration shown in FIG. 1 or FIG. 7. In the configuration of FIG. 8, however, the address decoder 120 is provided before the address-input circuit 210, which is in contrast with the address decoder 214 provided after the address-input circuit 210 in the configuration of FIG. 7.

This configuration allows the time required for the decoding process by the address decoder 120 to be ignored. Namely, the address data output from the address-input circuit 210 can be immediately supplied to the internal circuit 17 without any intervening cause of delay. This makes it possible to perform data-write operations and data-read operations at an earlier timing than in the configuration of FIG. 7, thereby achieving a higher operation speed of the semiconductor memory device.

FIG. 9 is a block diagram of a related-art configuration which shows details of address decoding operations. In FIG. 9, the same elements as those of FIG. 7 are referred to by the same numerals, and a description thereof will be omitted.

In a semiconductor memory device of FIG. 9, a redundancy-check unit 215 is provided for the purpose of making a redundancy check at the time of address decoding. In general, semiconductor memory devices are provided with redundant memory cells, which serve as substitute cells for defective memory cells. When a memory cell has a defect, a wired-logic operation through a fuse cut insures that a redundant memory cell, serving as a substitute for the defective memory cell, is accessed when an attempt is made to access the defective memory cell.

In FIG. 9, the address signals latched by the address-input circuit 210 are supplied to the redundancy-check unit 215 and a pre-decoder 216. When the supplied address is one which should be replaced by a corresponding redundant memory cell, a logic operation performed inside the redundancy-check unit 215 activates a redundancy-check signal Comx. That is, the redundancy-check signal Comx becomes active when a redundant memory cell is to be accessed, and becomes inactive when a normal memory cell is to be accessed. The redundancy-check signal Comx is supplied to the pre-decoder 216.

In addition to the address signals and the redundancy-check signal Comx, the pre-decoder 216 further receives an address-control signal Cdepz from the control circuit 211. The address-control signal Cdepz is comprised of a pulse, which indicates by a timing thereof when the pre-decoder 216 should output the address signals. When the redundancy-check signal Comx is active, i.e., when a normal memory cell rather than a redundant memory cell is to be accessed, the pre-decoder 216 pre-decodes the supplied address signals, and outputs the pre-decoded address to the address decoder 214 at a timing indicated by the address-control signal Cdepz. When the redundancy-check signal Comx is inactive, i.e., when a redundant memory cell is to be accessed, the pre-decoder 216 outputs a redundant address to the address decoder 214 at a timing indicated by the address-control signal Cdepz.

In the related-art configuration of FIG. 9, the redundancy-check unit 215 first generates the redundancy-check signal Comx, and, then, the pre-decoder 216 outputs a normal address or a redundant address at a timing indicated by the address-control signal Cdepz. The timing indicated by the address-control signal Cdepz thus needs to be later than the timing at which the redundancy-check signal Comx is generated. Further, the timings of the redundancy-check signal Comx and the address-control signal Cdepz should be separated from each other by a predetermined timing margin so as to allow the redundancy-check signal Comx to be stabilized.

Namely, a normal address or a redundant address is supplied to the address decoder 214 after waiting for the redundancy-check unit 215 to generate the redundancy-check signal Comx, all of which take place after the address-input circuit 210 latches address signals. The need to wait for the generation of the redundancy-check signal Comx hampers an effort to speed up operations of the semiconductor memory device.

Figure 10:
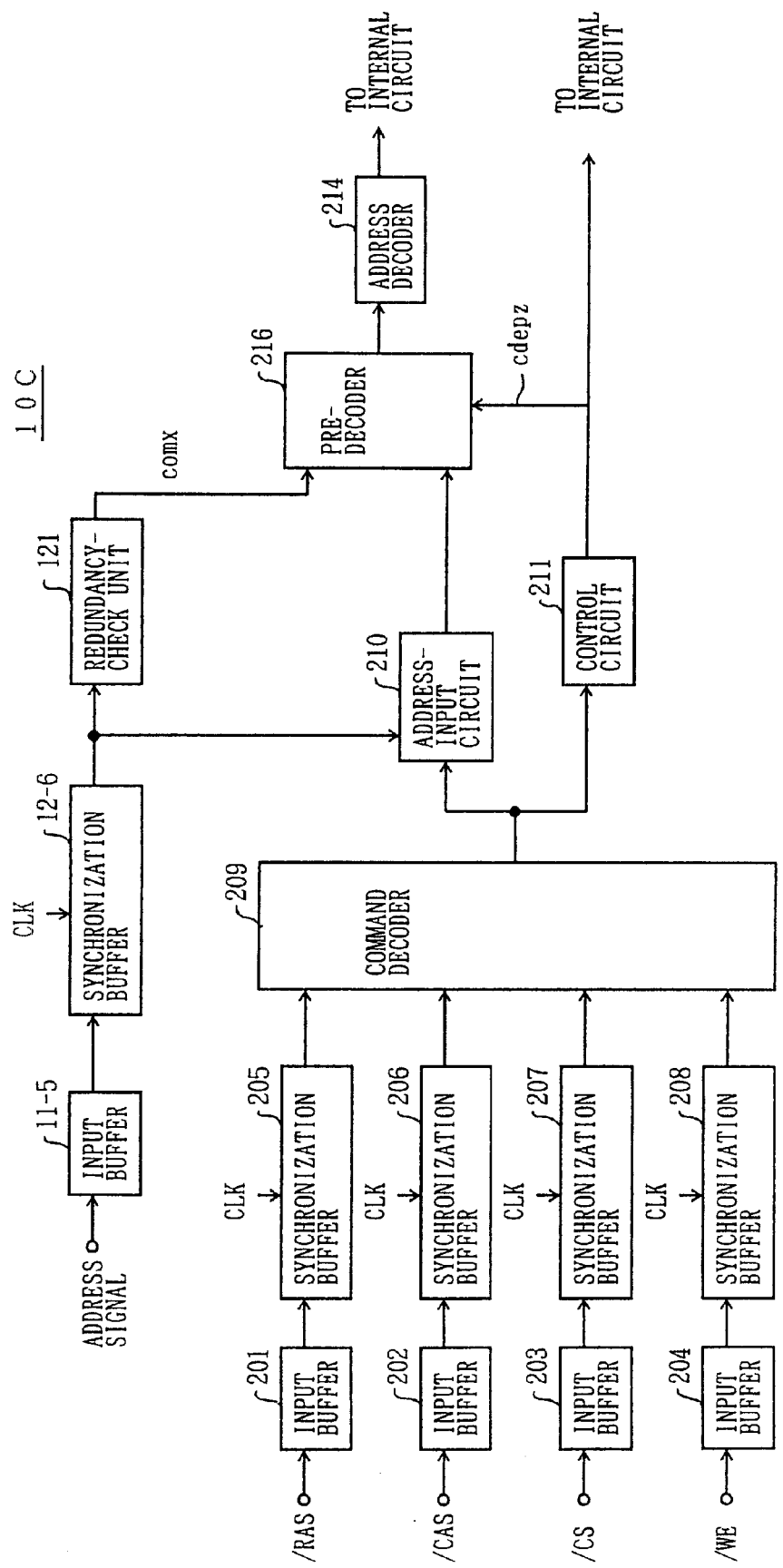
FIG. 10 is a block diagram of a fourth embodiment of a semiconductor memory device according to the present invention.

FIG. 10 is a block diagram of a fourth embodiment of a semiconductor memory device according to the present invention. In FIG. 10, the same elements as those of FIG. 9 are referred to by the same numerals, and a description thereof will be omitted.

A semiconductor memory device 10C of FIG. 10 supplies address signals to a redundancy-check unit 121 and the address-input circuit 210 when the address signals are input to the input buffer 11-5 and then to the synchronization buffer 12-6. The redundancy-check unit 121 performs a logic operation, and activates the redundancy-check signal Comx when the supplied address needs to be replaced by an address of a redundant memory cell. The redundancy-check signal Comx is supplied to the pre-decoder 216. Configurations of the address-input circuit 210, the redundancy-check unit 121, and the pre-decoder 216 are the same as those of the address-input circuit 210, the redundancy-check unit 215, and the pre-decoder 216 of FIG. 9, respectively.

In the configuration of FIG. 10, a redundancy check of the address signal is performed at least no later than the operation of the address-input circuit 210. Namely, the redundancy check of the address signal can be completed while the address-input circuit 210 latches the address signals upon a trigger from the command decoder 209, which has a relatively long time delay. By the time the address signals are supplied from the address-input circuit 210 to the pre-decoder 216, therefore, the redundancy-check signal Comx is already stable, so that the pre-decoder 216 can immediately output a normal address or a redundant address. In other words, since the timing of the redundancy-check signal Comx is advanced, the timing of the address-control signal Cdepz can be set to an earlier timing, achieving an earlier outputting of the normal address or the redundant address.

Figure 11:
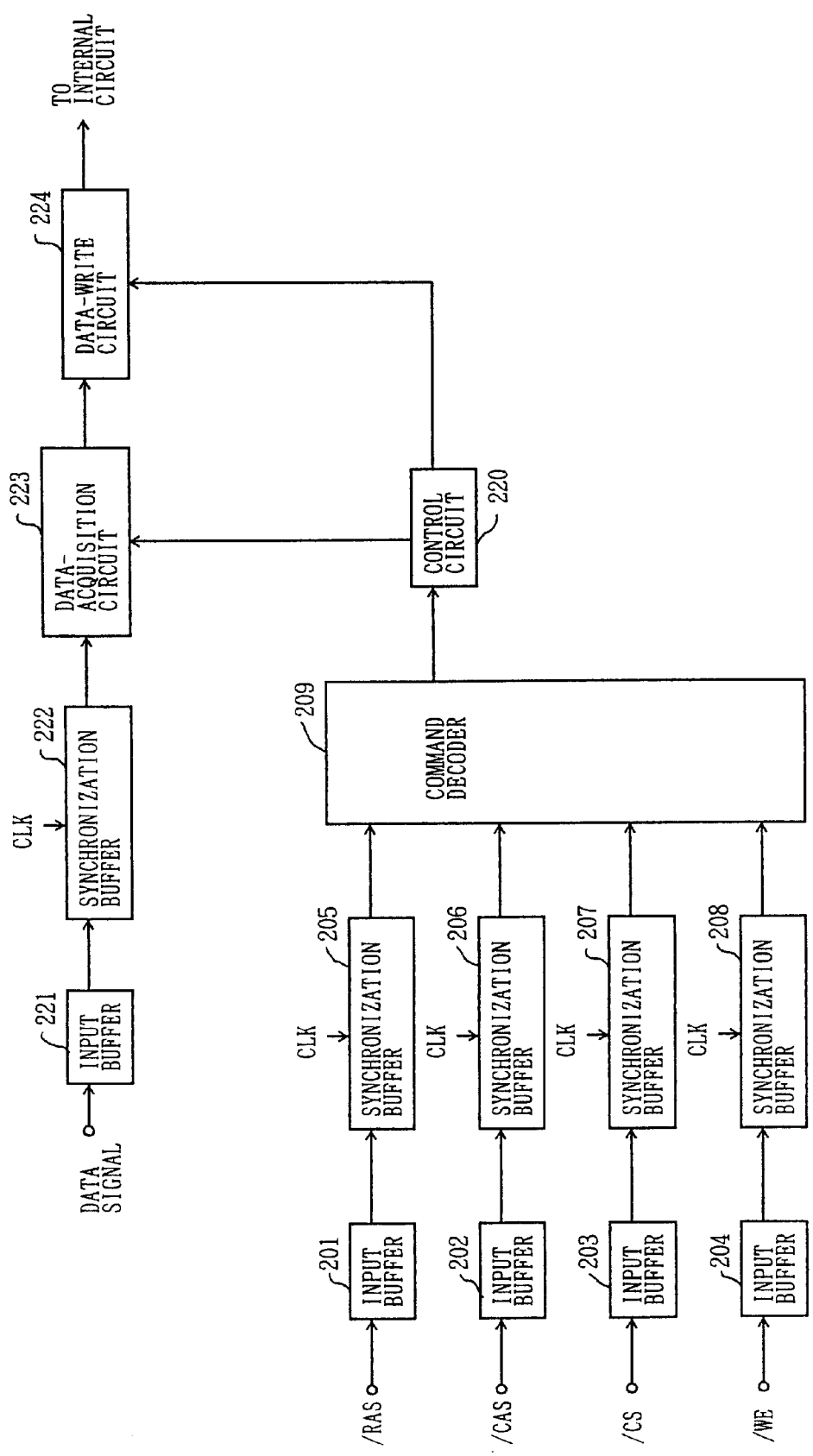
FIG. 11 is a block diagram showing a related-art configuration concerning a data-acquisition operation.

FIG. 11 is a block diagram showing a related-art configuration concerning a data-acquisition operation. In FIG. 11, the same elements as those of FIG. 1 are referred to by the same numerals, and a description thereof will be omitted.

In the semiconductor memory device of FIG. 11, data signals supplied via the input buffer 221 and the synchronization buffer 222 are taken in by a data-acquisition circuit 223 when the data-acquisition circuit 223 is prompted to do so by a control circuit 220. The latched data signals are then provided to a data-write circuit 224. The data-write circuit 224 writes the supplied data in an internal circuit in accordance with control signals supplied from the control circuit 220.

In the configuration shown in FIG. 11, the data-write circuit 224 has to wait for the data-acquisition circuit 223 to take in the data before engaging in an operation thereof. This waiting period constitutes a factor hampering an effort to achieve a higher operation speed of the semiconductor memory device.

Figure 12:
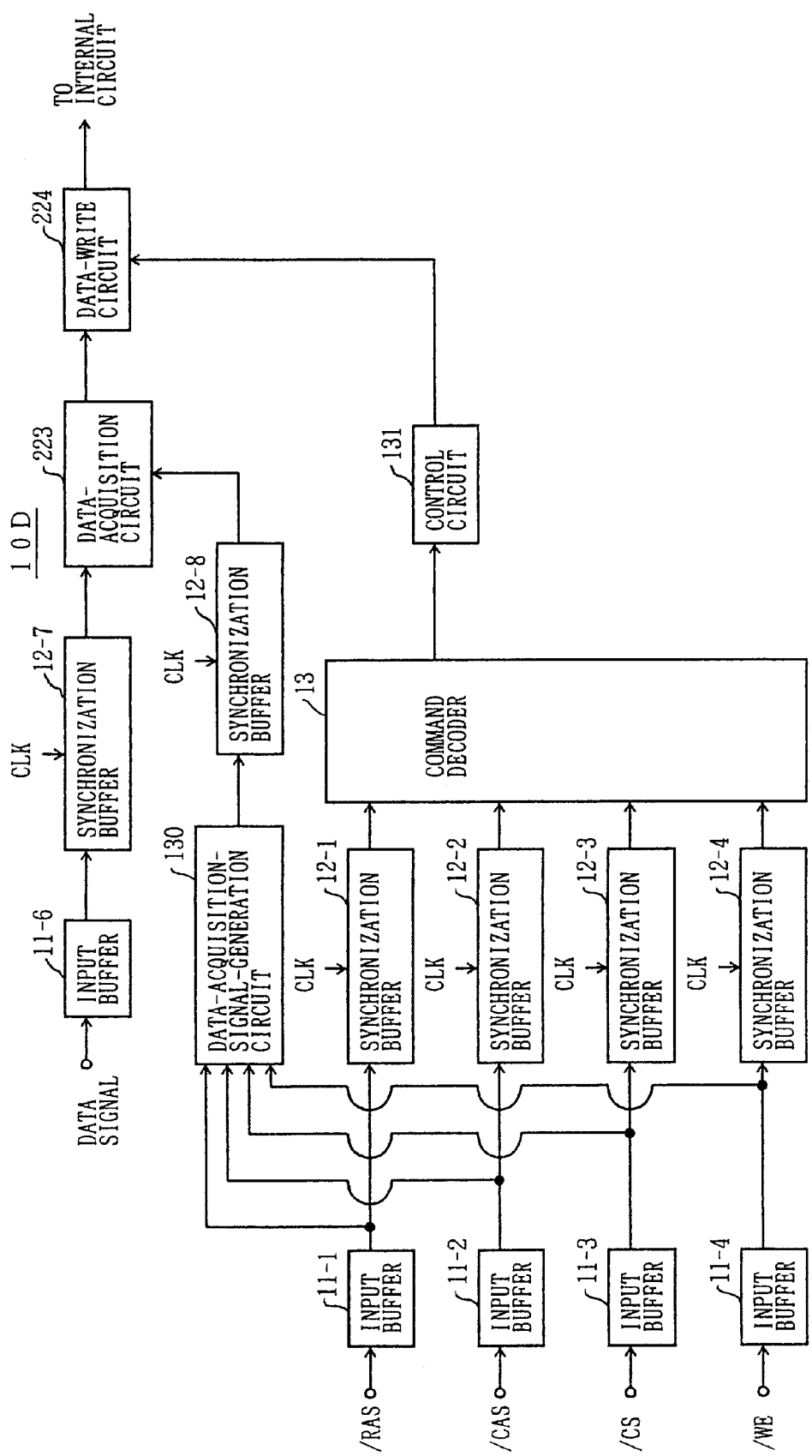
FIG. 12 is a block diagram of a fifth embodiment of a semiconductor memory device according to the present invention.

FIG. 12 is a block diagram of a fifth embodiment of a semiconductor memory device according to the present invention. In FIG. 12, the same elements as those of FIG. 11 are referred to by the same numerals, and a description thereof will be omitted.

A semiconductor memory device 10D of FIG. 12 is provided with a data-acquisition-signal-generation circuit 130 separate from the command decoder 13 in a similar manner that the address-latch-signal-generation circuit 14 is provided in the semiconductor memory device 10 of FIG. 2. A data-acquisition signal generated by the data-acquisition-signal-generation circuit 130 is supplied to the data-acquisition circuit 223 via a synchronization buffer 12-8. The data-acquisition circuit 223 takes in the data signal supplied via an input buffer 11-6 and a synchronization buffer 12-7 when the data-acquisition signal indicates an appropriate timing to do so.

The data-acquisition-signal-generation circuit 130 is not designed in such a manner to combat skews. There are cases, therefore, in which the data-acquisition-signal-generation circuit 130 erroneously outputs the data-acquisition signal even though a data-write operation is not indicated. In this case, however, no operational problem arises even when the data-acquisition circuit 223 supplies erroneously acquired meaningless data to the data-write circuit 224 because a control circuit 131 does not instruct a data-write operation. That is, the data-write circuit 224 is controlled by the control circuit 131, so that no malfunction takes place as long as an appropriate anti-skew measure is in place in the command decoder 13. Because of this, a high-speed logic circuit can be used for defining a data-acquisition timing without taking into account presence of skews.

Figure 13:
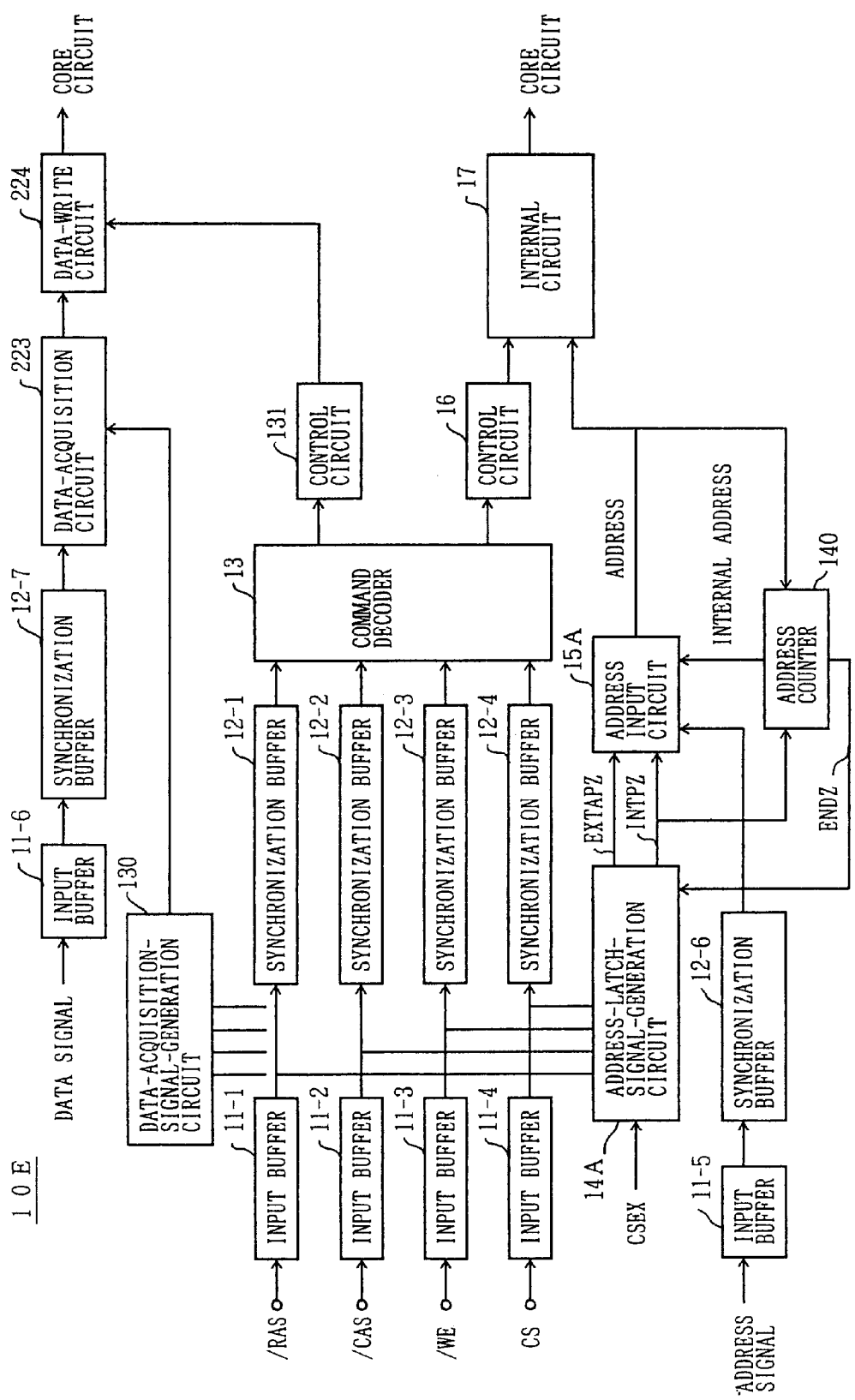
FIG. 13 is a block diagram of a sixth embodiment of a semiconductor memory device according to the present invention.

FIG. 13 is a block diagram of a sixth embodiment of a semiconductor memory device according to the present invention. In FIG. 13, the same elements as those of FIGS. 2, 6, and 12 are referred to by the same numerals, and a description thereof will be omitted.

A semiconductor memory device 10E of FIG. 13 is provided with a function to control a burst length. An address-latch-signal-generation circuit 14A and an address-input circuit 15A are provided in place of the address-latch-signal-generation circuit 14 and the address-input circuit 15, respectively, shown in FIG. 2. Here, the address-latch-signal-generation circuit 14A and the address-input circuit 15A are equipped with a function to control a burst length. In FIG. 13 showing the semiconductor memory device 10E, a configuration of the data-acquisition system of FIG. 12 is also illustrated for reference. The control circuit 16 and the control circuit 131 are respectively the same as the control circuit 16 shown in FIG. 2 and the control circuit 131 shown in FIG. 12. The semiconductor memory device 10E of FIG. 13 further includes an address counter 140.

Figure 14:
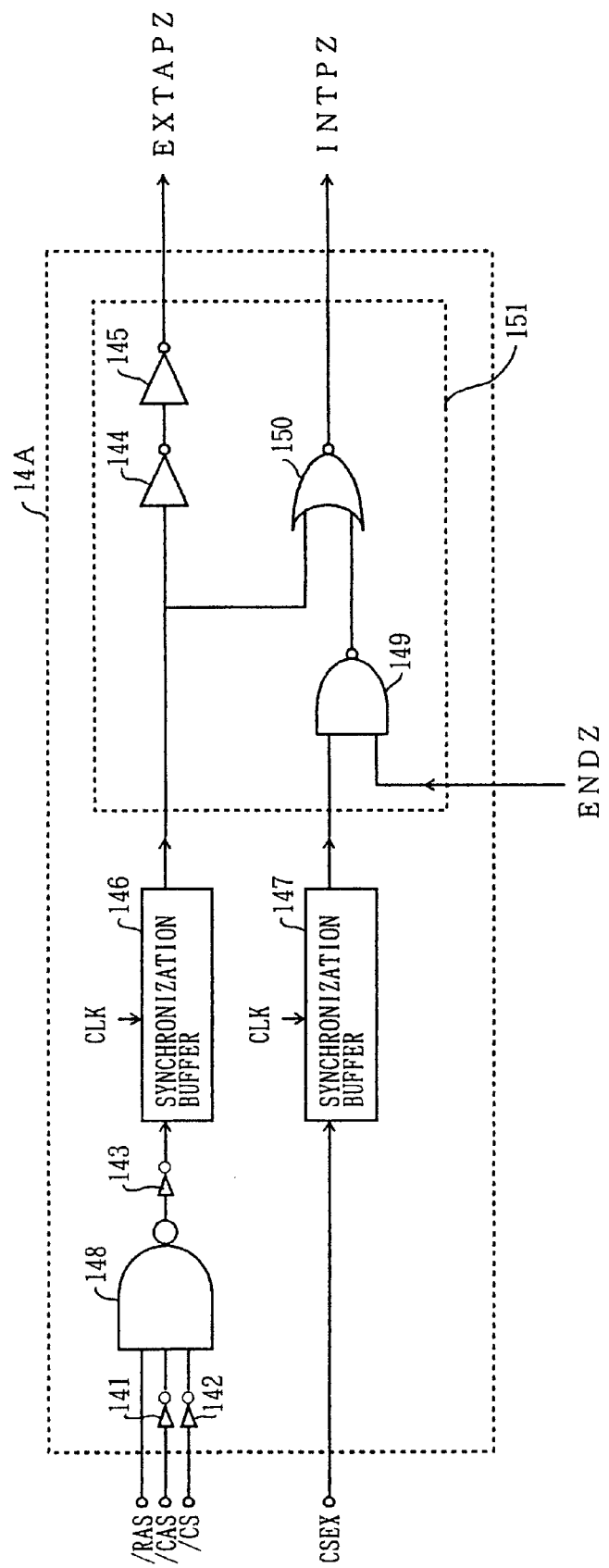
FIG. 14 is a circuit diagram showing a circuit configuration of an address-latch-signal-generation circuit shown in FIG. 13.

FIG. 14 is a circuit diagram showing a circuit configuration of the address-latch-signal-generation circuit 14A.

The address-latch-signal-generation circuit 14A includes inverters 141 through 145, synchronization buffers 146 and 147, NAND circuits 148 and 149, and a NOR circuit 150.

The address-latch-signal-generation circuit 14A receives command signals /RAS, /CAS, and /CS as well as a chip-active signal CSEX. The chip-active signal CSEX is activated when an active command is set, and is conventionally used in the related art.

FIGS. 15A through 15H are timing charts for explaining operations of the configuration shown in FIG. 13 and FIG. 14. With reference to FIGS. 13, 14, and 15A through 15H, burst-length-control operations will be described below.

As shown in FIGS. 15A through 15H, when the command signals /RAS, /CAS, and /CS are LOW, HIGH, and LOW, respectively, the chip-active signal CSEX is changed to LOW (i.e., deactivated). Further, when the command signals /RAS, /CAS, and /CS are HIGH, LOW, and LOW, respectively, a read/write command is set, so that a burst-start signal is supplied to a synchronization buffer 146. The synchronization buffer 146 outputs the burst-start signal in synchronism with the clock signal CLK. In this manner, the address-latch-signal-generation circuit 14A generates a burst-start-address-latch signal EXTAPZ, which is used for latching a burst-start address. Further, the address-latch-signal-generation circuit 14A generates an internally-generated-address-latch signal INTPZ, which is used for latching internally generated addresses.

As shown in FIG. 13, the burst-start-address-latch signal EXTAPZ and the internally-generated-address-latch signal INTPZ are supplied to the address-input circuit 15A. By using the burst-start-address-latch signal EXTAPZ, the address-input circuit 15A latches address signals as a burst-start address when the address signals are supplied via the input buffer 11-5 and the synchronization buffer 12-6.

The address counter 140 receives the burst-start address from the address-input circuit 15A, and generates consecutive addresses starting from the burst-start address. These consecutive addresses are supplied to the address-input circuit 15A as internally-generated addresses. The address-input circuit 15A latches the internally-generated addresses successively supplied from the address counter 140 based on the internally-generated-address-latch signal INTPZ.

Figure 15:
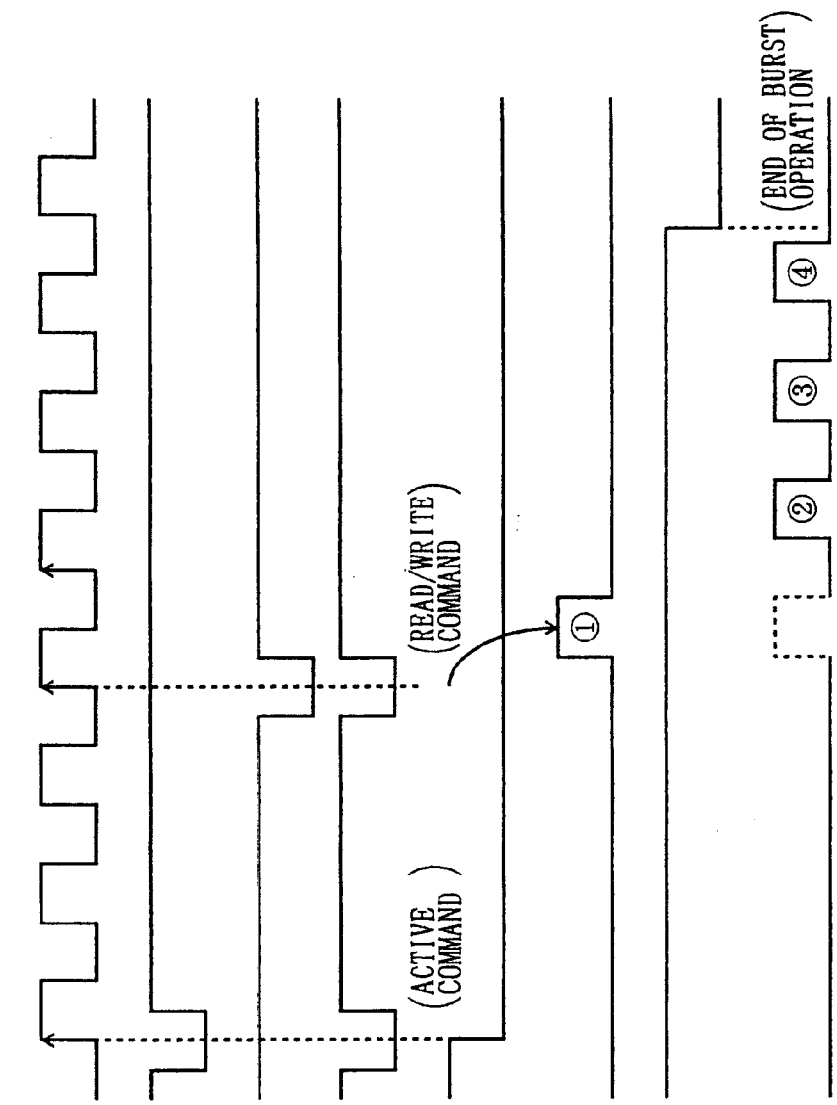
FIGS. 15A through 15H are timing charts for explaining operations of the configuration shown in FIG. 13 and FIG. 14.

FIGS. 15A through 15H shows a case where a burst length is set to four. In this case, the address counter 140 changes a signal ENDZ to LOW, and supplies the signal ENDZ to the address-latch-signal-generation circuit 14A. This change in the signal ENDZ is aimed at suppressing the generation of the internally-generated-address-latch signal INTPZ after the fourth address when addresses are counted by starting from the burst-start address as a first address. Because of the change in the signal ENDZ, the NAND gate 149 shown in FIG. 14 is closed, and, as shown in FIG. 15H, the internally-generated-address-latch signal INTPZ stops right after the fourth address. Here, the internally-generated-address-latch signal INTPZ is controlled such that no pulse is generated with respect to the burst-start address.

In this manner, the address-input circuit 15A successively supplies consecutive addresses to the internal circuit 17 in accordance with the burst length set in advance. In FIG. 14, the inverters 144 and 145, the NAND circuit 149, and the NOR circuit 150 together make up a burst-length-control circuit 151. The burst-length-control circuit 151 controls the number of pulses of the internally-generated-address-latch signal INTPZ, i.e., controls the burst length. Here, the inverters 144 and 145 are provided for the purpose of aligning the timing of the burst-start-address-latch signal EXTAPZ to the timing of the internally-generated-address-latch signal INTPZ.

A mechanism of controlling the burst length as described above is the same as that used in the related art. In the related art, however, the address-latch-signal-generation circuit 14A is included in the command decoder 13 in the same manner as in the configuration shown in FIG. 1, such that the command decoder having a relatively large delay generates the burst-start-address-latch signal EXTAPZ and the internally-generated-address-latch signal INTPZ. Configurations of the address-input circuit 15A and the address counter 140 shown in FIG. 13 are the same as those used in the related art. Since these configurations are well within the scope of ordinary skill in the art, a description thereof will be omitted.

Figure 16:
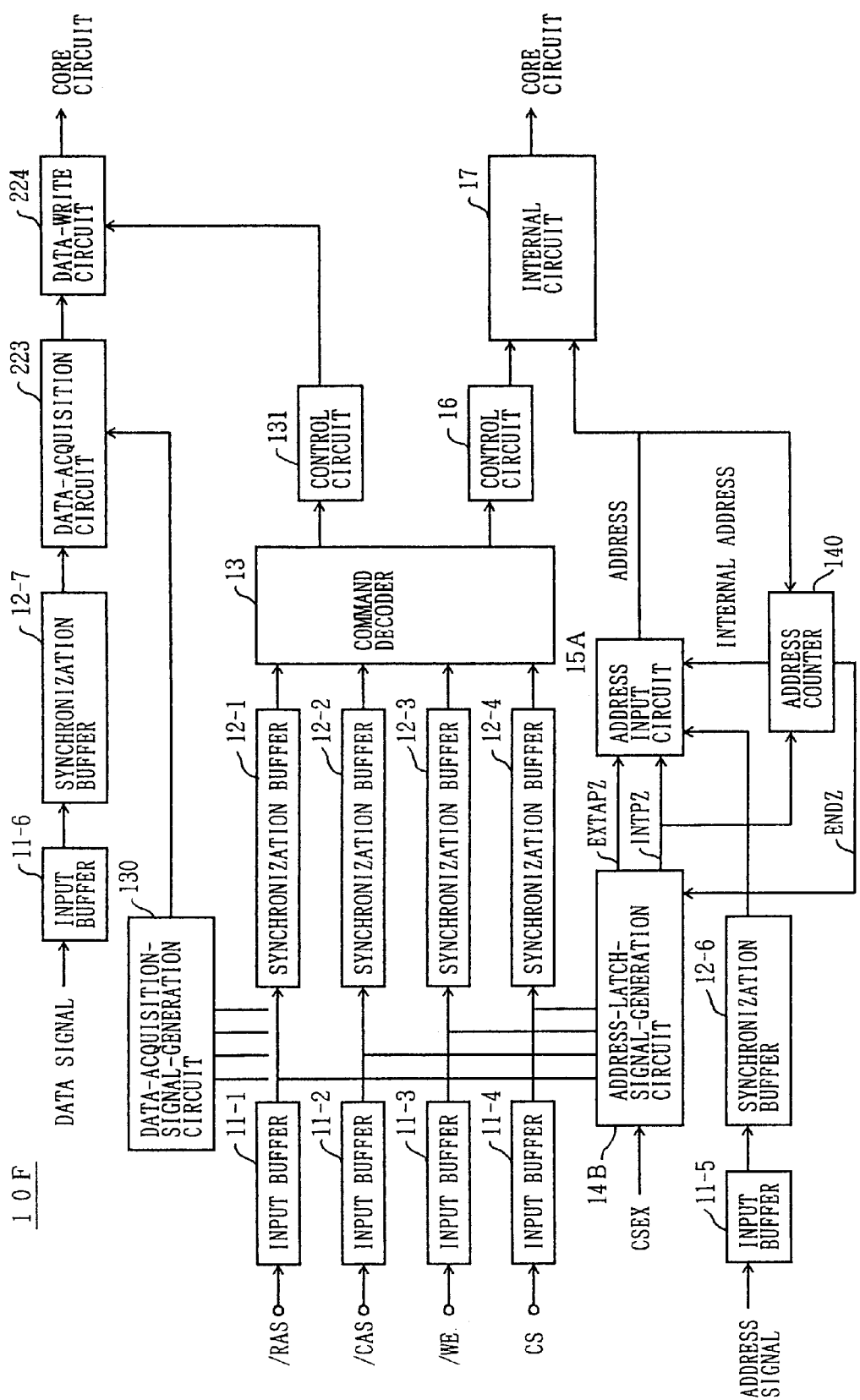
FIG. 16 is a block diagram of a seventh embodiment of a semiconductor memory device according to the present invention.

FIG. 16 is a block diagram of a seventh embodiment of a semiconductor memory device according to the present invention. In FIG. 16, the same elements as those of FIG. 13 are referred to by the same numerals, and a description thereof will be omitted. In the semiconductor device of FIG. 16, an address-latch-signal-generation circuit 14B is provided in place of the address-latch-signal-generation circuit 14A shown in FIG. 13.

Figure 17:
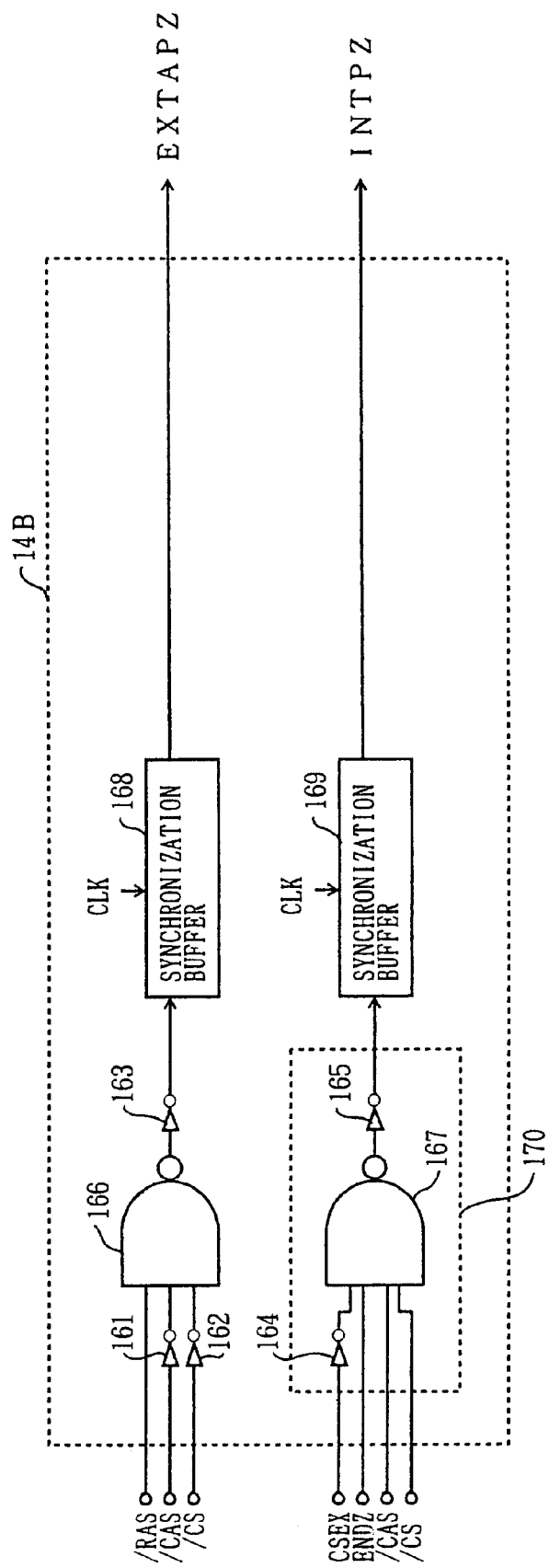
FIG. 17 is a circuit diagram showing a circuit configuration of an address-latch-signal-generation circuit shown in FIG. 16.

FIG. 17 is a circuit diagram showing a circuit configuration of the address-latch-signal-generation circuit 14B. The address-latch-signal-generation circuit 14B includes inverters 161 through 165, NAND circuits 166 and 167, and synchronization buffers 168 and 169.

The address-latch-signal-generation circuit 14B of FIG. 17 receives command signals /RAS, /CAS, and /CS, and further receives the signal ENDZ and the chip-active signal CSEX. Based on these received signals, the address-latch-signal-generation circuit 14B outputs the burst-start-address-latch signal EXTAPZ and the internally-generated-address-latch signal INTPZ. Operations of the address-latch-signal-generation circuit 14B shown in FIG. 17 are basically the same as those of the address-latch-signal-generation circuit 14A shown in FIG. 14, except that a timing of the output signals is earlier.

FIGS. 18A through 18H are timing charts for explaining operations of the configurations shown in FIG. 16 and FIG. 17.

Figure 18:
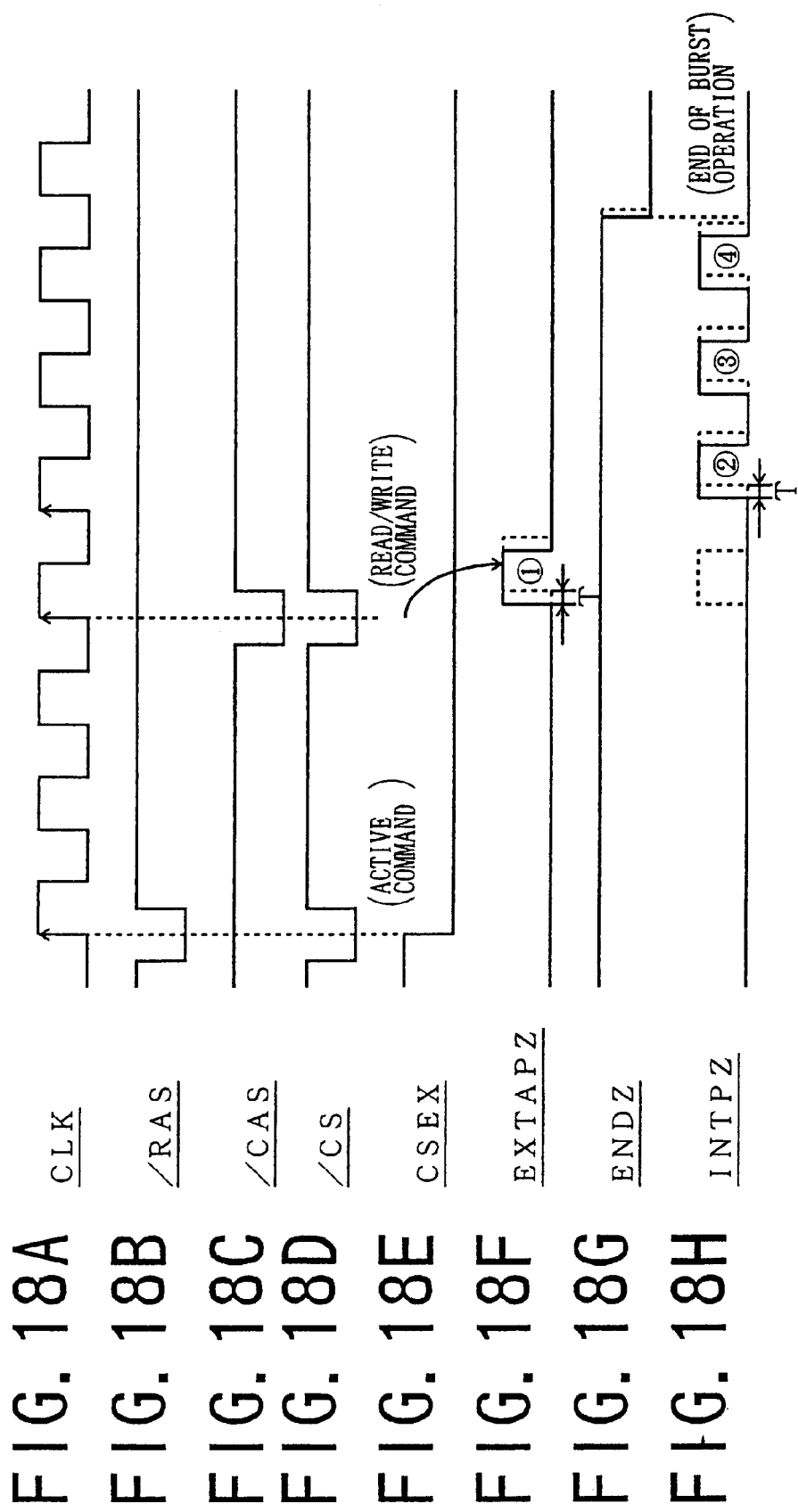
FIGS. 18A through 18H are timing charts for explaining operations of the configurations shown in FIG. 16 and FIG. 17.

Signal timings shown in FIGS. 18F through 18H are advanced in time in comparison with corresponding timings shown in FIGS. 15F through 15H. That is, the burst-start-address-latch signal EXTAPZ, the signal ENDZ, and the internally-generated-address-latch signal INTPZ have earlier timings than the previous example. In FIGS. 18F through 18H, the timings of the previous example (FIGS. 15F through 15H) are shown by dashed lines for comparison purposes. As shown in the figures, the timings of the burst-start-address-latch signal EXTAPZ, the signal ENDZ, and the internally-generated-address-latch signal INTPZ are advanced by a time margin T.

In FIG. 17, the inverters 164 and 165 and the NAND circuit 167 together make up a burst-length-control circuit 170. The burst-length-control circuit 170 makes it possible to generate three pulses of the internally-generated-address-latch signal INTPZ with respect to the second through fourth addresses following the first address serving as the burst-start address. This is shown in FIGS. 18A through 18H, and is the case when the burst length is 4.

In comparison with the configuration of FIG. 14 in which the burst-length-control circuit 151 is provided at a stage following the synchronization buffers 146 and 147, the burst-length-control circuit 170 of FIG. 17 is situated before the synchronization buffer 169 serving to establish synchronization. In the configuration of FIG. 17, therefore, the burst-start-address-latch signal EXTAPZ and the internally-generated-address-latch signal INTPZ are generated at an earlier timing. This makes it possible to shorten the time period spanning from the establishment of clock synchronization to the latching of the burst address, thereby enhancing the operation speed of the semiconductor memory device.

In connection with FIG. 16, the address-latch-signal-generation circuit 14B may be included in the command decoder 13, and may be comprised of a logic circuit having a relatively long delay. Even in such a case, it is apparent that the configuration of FIG. 17 can be employed. This configuration, in comparison with a configuration where the address-latch-signal-generation circuit 14B is comprised of a logic circuit faster than the command decoder 13, loses some benefit of earlier timings of the burst-start-address-latch signal EXTAPZ and the internally-generated-address-latch signal INTPZ. In comparison with the configuration shown in FIG. 14, however, the timings of the burst-start-address-latch signal EXTAPZ and the internally-generated-address-latch signal INTPZ are still earlier because the burst-length-control circuit is situated before the synchronization buffer.

In the following, some of the elements which have been described in connection with the forgoing various embodiments will be described.

Figure 19:
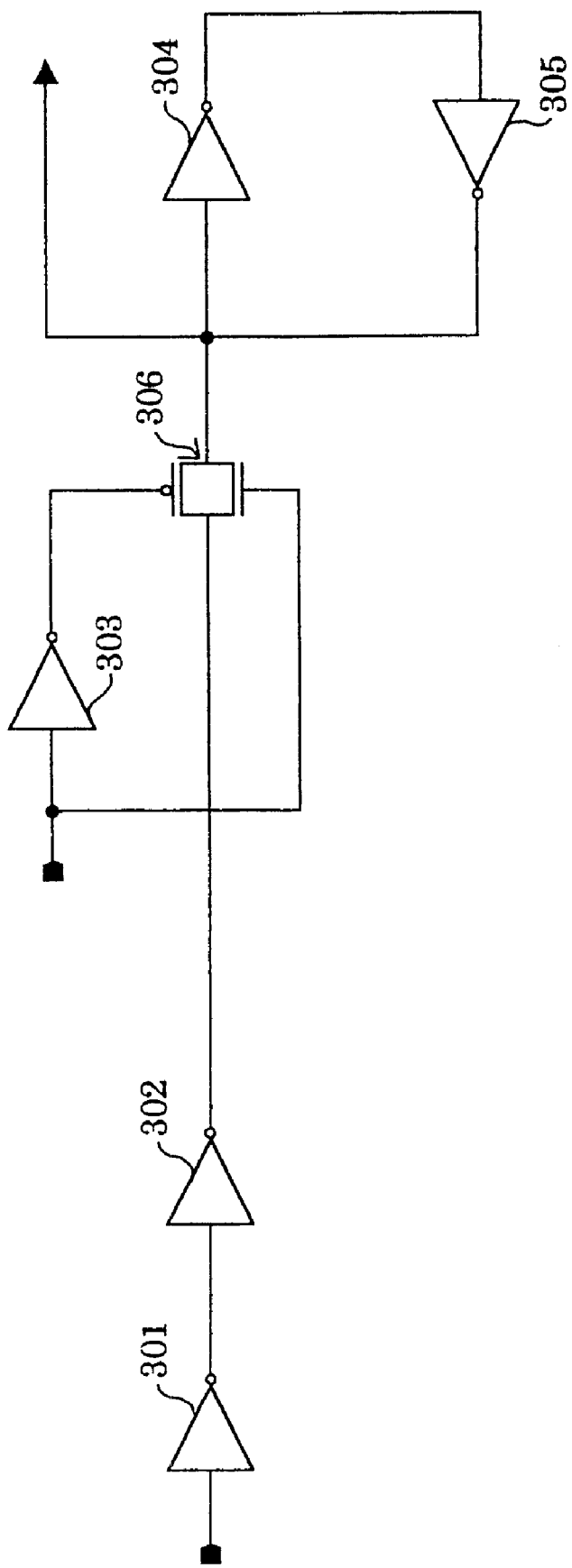
FIG. 19 is a circuit diagram showing a circuit structure of an address-input circuit

FIG. 19 is a circuit diagram showing a circuit structure of the address-input circuit (e.g., the address-input circuit 15 of FIG. 2). FIG. 19 shows a circuit structure which receives only one bit of the address signals. For a plurality of the address signals, the same configuration as shown in FIG. 19 will be provided for each of these address signals.

The address-input circuit includes inverters 301 through 305 and a transfer gate 306. The transfer gate 306 is comprised of an NMOS transistor and a PMOS transistor. The inverters 304 and 305 together form a latch.

The inverter 301 receives an address signal from an exterior of the semiconductor memory device. The inverter 303 receives a control signal, which is the address-latch signal supplied from the synchronization buffer 12-5 of FIG. 2, for example. When the control signal input to the inverter 303 becomes HIGH, the transfer gate 306 is opened so that the address signal reaches to the latch comprised of the inverters 304 and 305. Thus, the address signal is latched in the address-input circuit.

In this manner, the address-input circuit latches address signals when it is prompted at a certain timing. The address-input circuit keeps the latched address signals, even when the address signals input thereto are changed, until the next control signal comes in.

Figure 20:
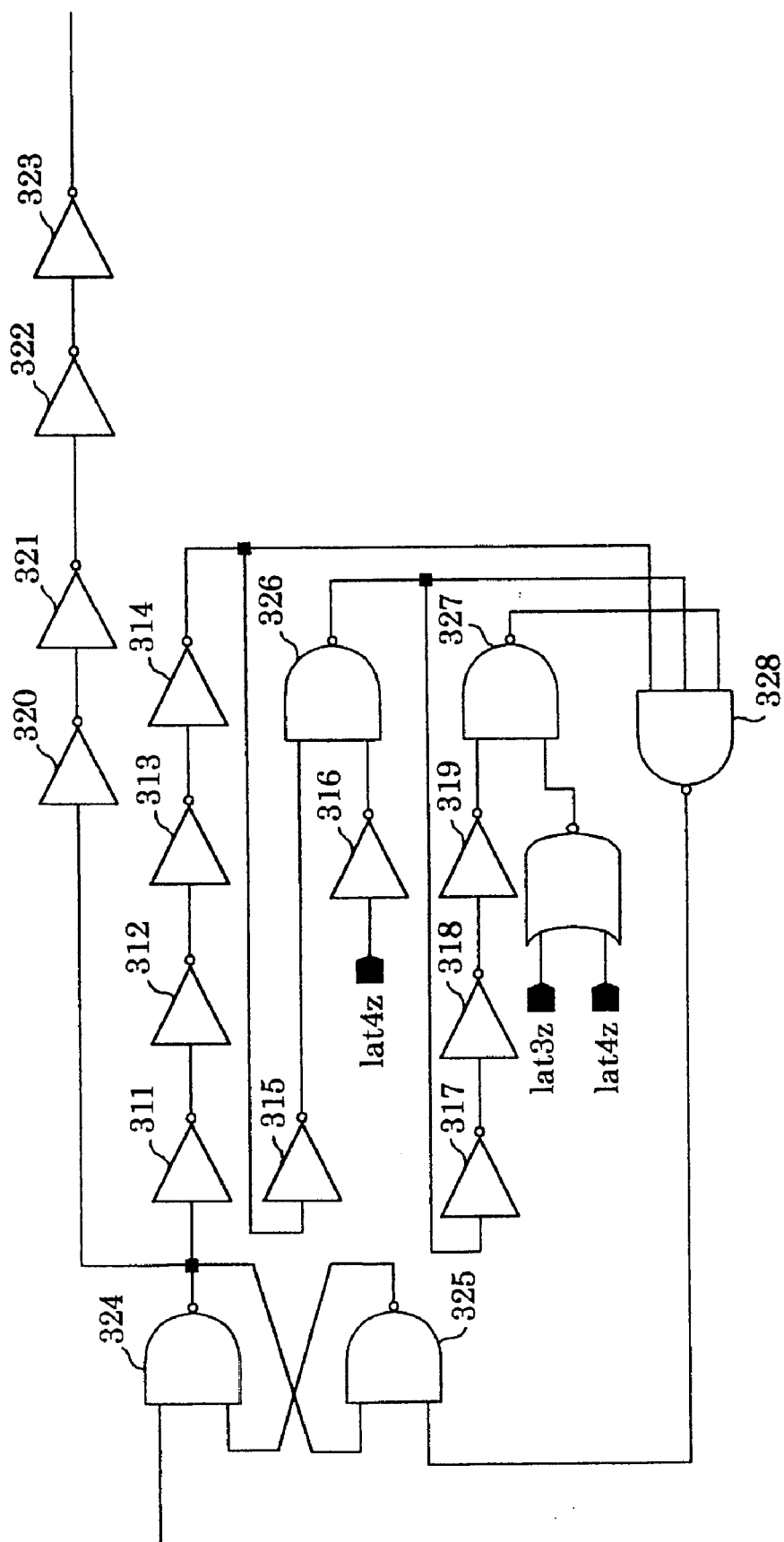
FIG. 20 is a circuit diagram showing a circuit structure of a control circuit shown in FIG. 7 through FIG. 10.

FIG. 20 is a circuit diagram showing a circuit structure of the control circuit 211 shown in FIG. 7 through FIG. 10.

The control circuit of FIG. 20 includes inverters 311 through 323 and NAND circuits 324 through 328. The NAND circuits 324 and 325 together form a latch, which receives a control signal from the command decoder 209 of FIG. 10, for example.

In an initial state, the control signal from the command decoder is HIGH, and an output of the latch (an output of the NAND circuit 324) is LOW, so that an output of the control circuit (an output of the inverter 323) is LOW. When the control signal is changed from HIGH to LOW, the output of the latch is changed to HIGH. This change to HIGH in the output of the latch propagates through several delay elements, and appears as a change to LOW in the output of the NAND circuit 328. By this time, the control signal has already returned to HIGH, so that the LOW output of the NAND circuit 328 changes the output of the latch to LOW. In this manner, when a LOW pulse of the control signal arrives at the input of the latch, the latch output is changed to HIGH, and so is the output of the control circuit. After a certain time period which is defined by the delay time of the feedback signal (i.e., the output of the NAND circuit 328), the latch output returns to LOW, and so does the output of the control circuit.

The above-mentioned time period can be adjusted by signals lat3z and lat4z. When the signals lat3z and lat4z are HIGH, only the output of the inverter 314 is relevant when a timing of the change to LOW in the output of the NAND circuit 328 is considered. When the signals lat3z and lat4z are HIGH and LOW, respectively, an output of the NAND circuit 326 becomes a sole factor relevant to the timing of the change to LOW in the output of the NAND circuit 328. An output of the NAND circuit 327 becomes a sole relevant factor when the signals lat3z and lat4z are both LOW. In this manner, the signals lat3z and lat4z together determine when the feedback signal (the output of the NAND circuit 328) changes to LOW, thereby defining the pulse width of the output of the latch. In other words, the signals lat3z and lat4z define the pulse width of the output of the control circuit.

In this manner, the control circuit supplies an output thereof which has an appropriate pulse width and an appropriate timing. Please note that the timing of the output is also adjustable by the number of delay elements (i.e., the number of the inverters 320 through 323). In FIG. 10, for example, the output of the control signal is supplied as the address-control signal Cdepz to the pre-decoder 216.

Figure 21:
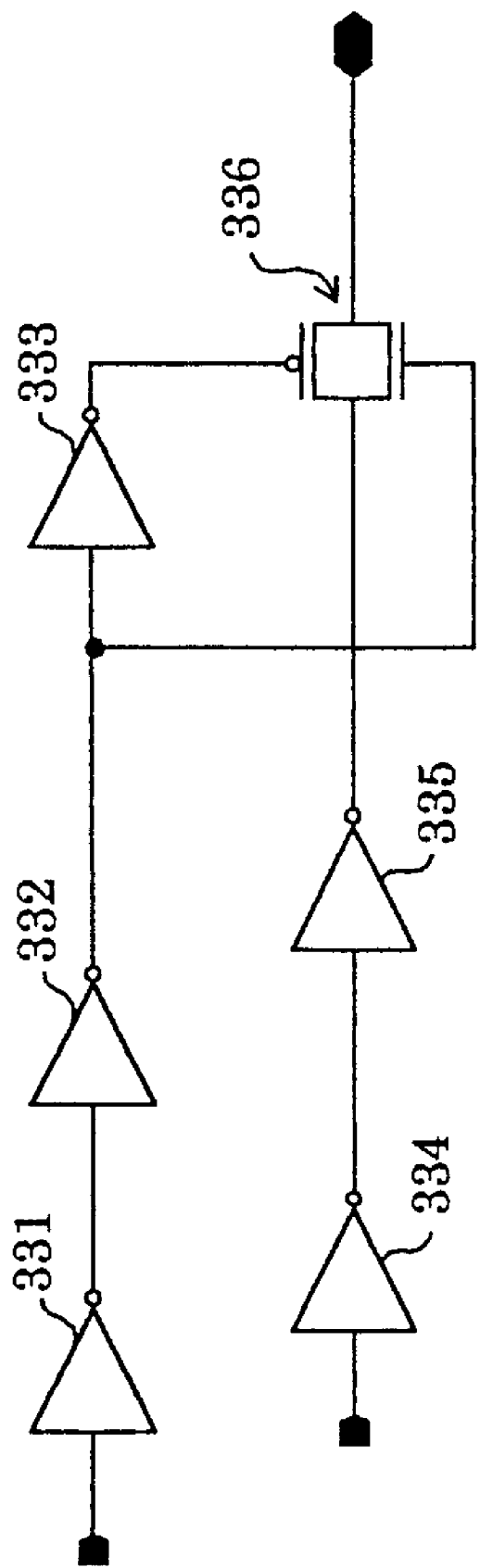
FIG. 21 is a circuit diagram showing a circuit configuration of a data-acquisition circuit shown in FIGS. 11–13 and 16.

FIG. 21 is a circuit diagram showing a circuit configuration of the data-acquisition circuit 223 shown in FIG. 11–13 and 16. FIG. 21 shows a circuit structure which receives only one bit of the data signals. For a plurality of the data signals, the same configuration as shown in FIG. 21 will be provided for each of these data signals.

The data-acquisition circuit 223 of FIG. 21 includes inverters 331 through 335 and a transfer gate 336. The transfer gate 336 is comprised of a PMOS transistor and an NMOS transistor. The inverter 331 receives a control signal, which is supplied from the synchronization buffer 12-8 in an example of FIG. 12. The inverter 334 receives a data signal. As the control signal is changed to HIGH, the transfer gate opens, and allows the passage of the data signal therethrough. In this manner, the data-acquisition circuit 223 takes data in.

Figure 22:
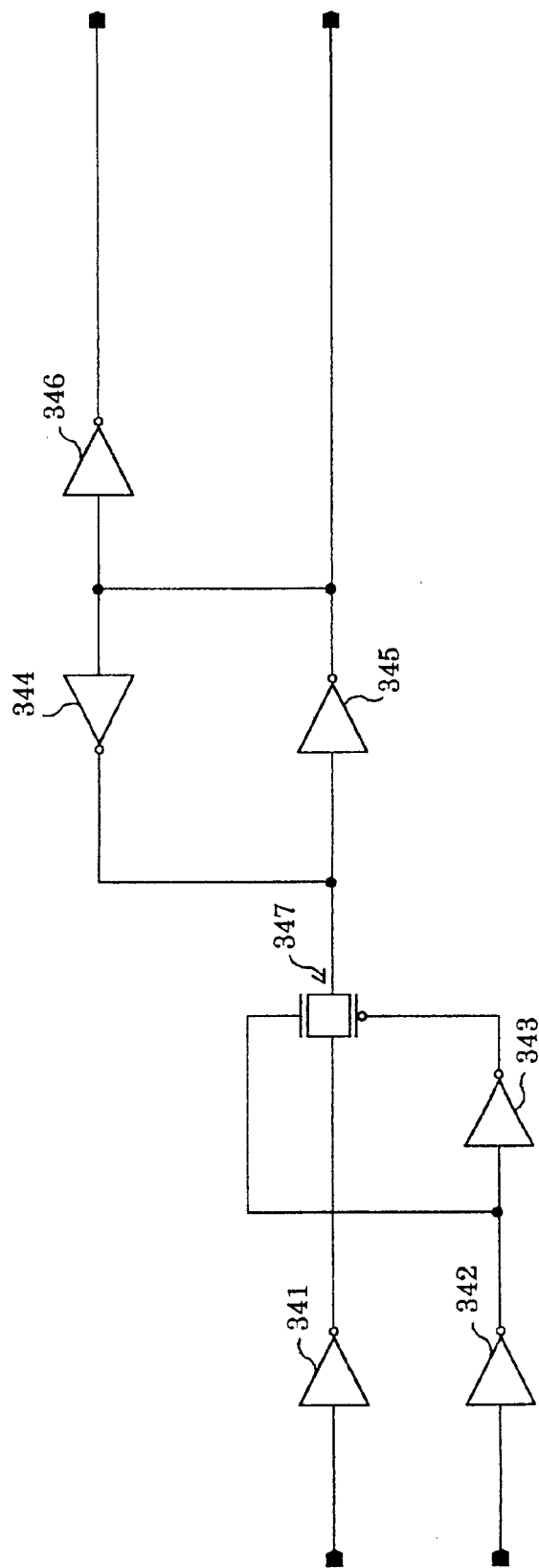
FIG. 22 is a circuit diagram showing a circuit configuration of a data-write circuit shown in FIGS. 11–13 and 16.

FIG. 22 is a circuit diagram showing a circuit configuration of the data-write circuit 224 shown in FIG. 11–13 and 16. FIG. 22 shows a circuit structure which receives only one bit of the data signals. For a plurality of the data signals, the same configuration as shown in FIG. 22 will be provided for each of these data signals.

The data-write circuit 224 of FIG. 22 includes inverters 341 through 346 and a transfer gate 347 The transfer gate 347 is comprised of a PMOS transistor and an NMOS transistor. The inverter 341 receives a data signal when the data signal is taken in by the data-acquisition circuit 223. The inverter 342 receives a control signal, which is supplied from the control circuit 131 in an example of FIG. 12. As the control signal is changed to LOW, the transfer gate is opened, so that a latch comprised of the inverters 344 and 345 latches the supplied data signal.

In this manner, the data-write circuit 224 latches the data signal at a timing indicated by the control signal, and provides the data signal to an internal circuit for the purpose of data writing.

Further, the present invention is not limited to these embodiments, but various variations and modifications may be made without departing from the scope of the present invention.

What is claimed is:

1. A semiconductor memory device comprising:
   a command decoder which decodes input-command signals to supply decoded-command signals;
   buffers which receive input-address signals;
   an address-input circuit which latches said input-address signals supplied from said buffers in response to at least one of said decoded-command signals;
   a redundancy-check unit which receives said input-address signals from said buffers, and checks whether said input-address signals indicate a redundant address; and
   an address decoder which receives said input-address signals from said address-input circuit and redundancy-check results from said redundancy-check unit, and decodes said input-address signals to supply decoded-address signals in accordance with said redundancy-check results.

2. The semiconductor memory device as claimed in claim 1, wherein said address decoder includes:
   an address pre-decoder which receives said input-address signals from said address-input circuit and said redundancy-check results from said redundancy-check unit, and decodes said input-address signals to supply pre-decoded-address signals in accordance with said redundancy-check results; and a decoder which decodes said pre-decoded-address signals to supply said decoded-address signals.

3. A semiconductor memory device comprising:

a first circuit which supplies a burst-start-address-latch pulse in synchronism with a clock signal, said burst-start-address-latch pulse being used for latching a burst-start address supplied from an exterior of said semiconductor memory device; and a second circuit which supplies internally-generated-address-latch pulses in synchronism with said clock signal, said internally-generated-address-latch pulses being used for latching internal addresses which are internally generated to follow said burst-start address, wherein said second circuit includes:

a burst-length-control circuit which generates a period indicating signal for indicating a time period during which said internally-generated-address-latch pulses are generated; and a synchronization circuit which generates said internally-generated-address-latch pulses by synchronizing said period indicating signal to said clock signal.

4. The semiconductor memory device as claimed in claim 3, wherein said burst-length-control circuit includes a logic circuit which generates said period indicating signal based on input-command signals and other signals, said other signals including a signal indicative of an end of a burst period and a signal indicative of an active state which is set to said semiconductor memory device by the input-command signals.

5. The semiconductor memory device as claimed in claim 3, wherein said first circuit includes:

a logic circuit which generates a burst-start signal when input-command signals show a predetermined combination of signal levels; and a synchronization circuit which generates said burst-start-address-latch pulse by synchronizing said burst-start signal to said clock signal.

* * * * *